US012148401B2

(12) United States Patent
Lin et al.

(10) Patent No.: US 12,148,401 B2
(45) Date of Patent: Nov. 19, 2024

(54) DISPLAY SUBSTRATE, DISPLAY DEVICE AND COMPENSATION METHOD THEREOF

(71) Applicants: BEIJING BOE OPTOELECTRONICS TECHNOLOGY CO., LTD., Beijing (CN); BOE Technology Group Co., Ltd., Beijing (CN)

(72) Inventors: Zhengri Lin, Beijing (CN); Wenchao Han, Beijing (CN); Xinle Wang, Beijing (CN); Yifan Song, Beijing (CN); Wanzhi Chen, Beijing (CN); Jing Liu, Beijing (CN); Wei Sun, Beijing (CN); Rui Liu, Beijing (CN); Xin Duan, Beijing (CN); Zhaohui Meng, Beijing (CN); Mingming Wang, Beijing (CN); Lianghao Zhang, Beijing (CN); Jiantao Liu, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/778,865

(22) PCT Filed: Jun. 23, 2021

(86) PCT No.: PCT/CN2021/101828
§ 371 (c)(1),
(2) Date: May 23, 2022

(87) PCT Pub. No.: WO2022/266884
PCT Pub. Date: Dec. 29, 2022

(65) Prior Publication Data
US 2024/0169947 A1 May 23, 2024

(51) Int. Cl.
G09G 3/36 (2006.01)
G02F 1/133 (2006.01)
(Continued)

(52) U.S. Cl.
CPC ....... *G09G 3/3607* (2013.01); *G02F 1/13318* (2013.01); *G02F 1/136204* (2013.01);
(Continued)

(58) Field of Classification Search
CPC ......... G09G 3/3607; G09G 2320/0233; G09G 2320/0242; G09G 2360/144; G02F 1/13318; G02F 1/136204; H01L 27/1443
See application file for complete search history.

(56) References Cited

U.S. PATENT DOCUMENTS

2007/0278488 A1* 12/2007 Hirabayashi ...... H01L 27/14683
257/E27.131
2007/0281430 A1* 12/2007 Hirabayashi ........ H01L 27/1255
257/E27.113
(Continued)

FOREIGN PATENT DOCUMENTS

CN 101097389 A 1/2008
CN 101105616 A 1/2008
(Continued)

*Primary Examiner* — David Tung
(74) *Attorney, Agent, or Firm* — Ling Wu; Stephen Yang; Ling and Yang Intellectual Property

(57) ABSTRACT

A display substrate includes a base substrate, a plurality of photosensitive transistor units, a plurality of photosensitive ESD protection units, and at least one common signal line. The base substrate includes a display region, a peripheral region located at a periphery of the display region, and a binding region located at a side of the display region. The plurality of photosensitive transistor units, the plurality of photosensitive ESD protection units and the at least one common signal line are located in the peripheral region. The plurality of photosensitive transistor units is connected with
(Continued)

binding pins in the binding region through a plurality of signal lines. At least one photosensitive ESD protection unit is connected with, and located between, at least one signal line and the common signal line.

20 Claims, 7 Drawing Sheets

(51) Int. Cl.
*G02F 1/1362* (2006.01)
*H01L 27/144* (2006.01)

(52) U.S. Cl.
CPC . *H01L 27/1443* (2013.01); *G09G 2320/0233* (2013.01); *G09G 2320/0242* (2013.01); *G09G 2360/144* (2013.01)

(56) References Cited

U.S. PATENT DOCUMENTS

| | | | |
|---|---|---|---|
| 2008/0001885 | A1 | 1/2008 | Yanagisawa et al. |
| 2010/0052713 | A1* | 3/2010 | Kunimori .............. G09G 3/006 |
| | | | 324/754.01 |
| 2019/0067218 | A1* | 2/2019 | Lin ..................... H01L 27/0292 |
| 2019/0312060 | A1 | 10/2019 | Zhou et al. |
| 2021/0405410 | A1 | 12/2021 | Wang et al. |

FOREIGN PATENT DOCUMENTS

| | | |
|---|---|---|
| CN | 105959491 A | 9/2016 |
| CN | 108519707 A | 9/2018 |
| CN | 108550584 A | 9/2018 |
| CN | 111445869 A | 7/2020 |
| CN | 111624799 A | 9/2020 |
| CN | 112542089 A | 3/2021 |
| CN | 112928134 A | 6/2021 |

* cited by examiner

DISPLAY SUBSTRATE, DISPLAY DEVICE AND COMPENSATION METHOD THEREOF

CROSS-REFERENCE TO RELATED APPLICATION

The present application is a U.S. National Phase Entry of International Application No. PCT/CN2021/101828 having an international filing date of Jun. 23, 2021, the entire content of which is incorporated herein by reference.

TECHNICAL FIELD

The present disclosure relates to, but is not limited to, the field of display technology, in particular to a display substrate and a display device and a compensation method thereof.

BACKGROUND

A light sensor for detecting ambient light is provided on a display product, and the light sensor is generally located above the screen. After detecting the ambient light with the light sensor, the ambient light brightness of the environment in which the display product is located can be obtained, and then the screen brightness of the display product can be automatically adjusted according to the ambient light brightness, bringing the best visual effect to a user.

SUMMARY

The following is a summary of subject matters described herein in detail. The summary is not intended to limit the scope of protection of claims.

At least one embodiment of the present disclosure provides a display substrate, a display device and a compensation method thereof.

In one aspect, an embodiment of the present disclosure provides a display substrate including a base substrate, a plurality of photosensitive transistor units, a plurality of photosensitive ESD protection units, and at least one common signal line. The base substrate includes a display region, a peripheral region located at a periphery of the display region, and a binding region located at a side of the display region. The plurality of photosensitive transistor units, the plurality of photosensitive ESD protection units and the at least one common signal line are located in the peripheral region. The plurality of photosensitive transistor units is connected with the binding pins in the binding region through a plurality of signal lines. At least one photosensitive ESD protection unit is connected with, and located between, at least one signal line and the common signal line.

In some exemplary implementations, the display region is provided with a common signal ESD ring connected with the common signal line; and at least one photosensitive ESD protection unit is connected with the common signal ESD ring.

In some exemplary implementations, the peripheral region is further provided with a data line ESD protection unit connected with the common signal ESD ring in the display region. The plurality of photosensitive transistor units are located at a side of the data line ESD protection unit away from the display region, and at least one photosensitive ESD protection unit is connected with the data line ESD protection unit.

In some exemplary implementations, the peripheral region is provided with a gate drive circuit, and the plurality of signal lines are located at a side of the gate drive circuit close to the display region.

In some exemplary implementations, the common signal line is located at a side of the gate drive circuit away from the display region.

In some exemplary implementations, the display region further includes a first shading layer located on a side of the plurality of photosensitive transistor units away from the base substrate. The plurality of photosensitive transistor units at least includes: a reference transistor unit and a brightness sensing transistor unit; an orthographic projection of the first shading layer on the base substrate contains an orthographic projection of the reference transistor unit on the base substrate, and the orthographic projection of the first shading layer on the base substrate does not overlap or partially overlaps with an orthographic projection of the brightness sensing transistor unit on the base substrate.

In some exemplary implementations, the reference transistor unit includes a plurality of reference transistors, and the brightness sensing transistor unit includes a plurality of brightness sensing transistors. The plurality of signal lines at least includes a first signal line, a second signal line, a third signal line and a fourth signal line. Gate electrodes of the plurality of reference transistors and the plurality of brightness sensing transistors are connected with the first signal line, first electrodes of the plurality of reference transistors and the plurality of brightness sensing transistors are connected with the second signal line, second electrodes of the plurality of reference transistors are connected with the third signal line, and second electrodes of the plurality of brightness sensing transistors are connected with the fourth signal line.

In some exemplary implementations, the plurality of photosensitive ESD protection units includes a first photosensitive ESD protection unit, a second photosensitive ESD protection unit, a third photosensitive ESD protection unit, and a fourth photosensitive ESD protection unit. The first signal line is connected with the first photosensitive ESD protection unit, the second signal line is connected with the second photosensitive ESD protection unit, the third signal line is connected with the third photosensitive ESD protection unit, and the fourth signal line is connected with the fourth photosensitive ESD protection unit. The first photosensitive ESD protection unit and the second photosensitive ESD protection unit are located at a side of the plurality of photosensitive transistor units away from the display region, and the third photosensitive ESD protection unit and the fourth photosensitive ESD protection unit are located at a side of the plurality of photosensitive transistor units close to the display region.

In some exemplary implementations, the first photosensitive ESD protection unit and the second photosensitive ESD protection unit are directly connected with the common signal line; the third photosensitive ESD protection unit and the fourth photosensitive ESD protection unit are connected with the common signal ESD ring in the display region.

In some exemplary implementations, the display substrate further includes a first color filter layer located in the peripheral region and on a side of the plurality of photosensitive transistor units away from the base substrate. The first color filter layer includes a first filter unit, a second filter unit, a third filter unit, a light transmission unit and a shading unit. The plurality of photosensitive transistor units includes a brightness photosensitive transistor unit, a reference transistor unit, a first color photosensitive transistor unit, a second color photosensitive transistor unit, and a third color photosensitive transistor unit. An orthographic projection of the first filter unit on the base substrate contains an orthographic projection of the first color photosensitive transistor unit on the base substrate, an orthographic projection of the second filter unit on the base substrate contains an orthographic projection of the second color photosensitive transistor on the base substrate, an orthographic projection of the third filter unit on the base substrate contains the orthographic projection of the third color photosensitive transistor unit on the base substrate, an orthographic projection of the light transmission unit on the base substrate contains an orthographic projection of the brightness sensing transistor unit on the base substrate, and an orthographic projection of the shading unit on the base substrate contains an orthographic projection of the reference transistor unit on the base substrate.

In some exemplary implementations, the display substrate further includes a second color filter layer located in the display region. The second color filter layer and the first color filter layer are located in a same layer.

In some exemplary implementations, the display substrate further includes a second color filter layer located in the display region. In a plane perpendicular to the display substrate, a distance from the first color filter layer to the photosensitive transistor unit is smaller than a distance from the second color filter layer to the photosensitive transistor unit.

In some exemplary implementations, the first color photosensitive transistor unit includes a plurality of first color photosensitive transistors, the second color photosensitive transistor unit includes a plurality of second color photosensitive transistors, the third color photosensitive transistor unit includes a plurality of third color photosensitive transistors, the brightness sensing transistor unit includes a plurality of brightness sensing transistors, and the reference transistor unit includes a plurality of reference transistors. The plurality of signal lines includes a fifth signal line, a sixth signal line, a seventh signal line, an eighth signal line, a ninth signal line, a tenth signal line, an eleventh signal line, and a twelfth signal line. Gate electrodes of the plurality of first color photosensitive transistors, the plurality of second color photosensitive transistors and the plurality of third color photosensitive transistors are connected with the fifth signal line. Gate electrodes of the plurality of brightness sensing transistors and the plurality of reference transistors are connected with the sixth signal line. First electrodes of the plurality of first color photosensitive transistors, the plurality of second color photosensitive transistors, the plurality of third color photosensitive transistors, the plurality of brightness sensing transistors and the plurality of reference transistors are connected with the seventh signal line. Second electrodes of the plurality of first color photosensitive transistors are connected with the eighth signal line. Second electrodes of the plurality of second color photosensitive transistors are connected with the ninth signal line. Second electrodes of the plurality of third color photosensitive transistors are connected with the tenth signal line. Second electrodes of the plurality of brightness sensing transistors are connected with the eleventh signal line. Second electrodes of the plurality of reference transistors are connected with the twelfth signal line.

In some exemplary implementations, each of the fifth to twelfth signal lines is connected with one photosensitive ESD protection unit.

In some exemplary implementations, the quantity of first color photosensitive transistors included in the first color photosensitive transistor unit, the quantity of second color photosensitive transistors included in the second color photosensitive transistor unit, and the quantity of third color photosensitive transistors included in the third color photosensitive transistor unit are the same. The quantity of brightness sensing transistors included in the brightness sensing transistor unit is the same as the quantity of reference transistors included in the reference transistor unit.

In some exemplary implementations, the quantity of first color photosensitive transistors included in the first color photosensitive transistor unit is different from the quantity of brightness sensing transistors included in the brightness sensing transistor unit.

In some exemplary implementations, the plurality of photosensitive transistor units is sequentially arranged along a first direction.

In some exemplary implementations, in a plane perpendicular to the display substrate, the display substrate includes: a first conductive layer, a semiconductor layer and a second conductive layer sequentially arranged on the base substrate, wherein the first conductive layer at least includes gate electrodes of the transistors in the photosensitive transistor units, the semiconductor layer at least includes active layers of the transistors in the photosensitive transistor units, and the second conductive layer at least includes first electrodes and second electrodes of the transistors in the photosensitive transistor units.

In another aspect, an embodiment of the present disclosure provides a display device, which includes the aforementioned display substrate.

In another aspect, an embodiment of the present disclosure provides a compensation method for a display device, which is applied to the display device as described above. The compensation method includes: obtaining a reference current and a detection current of light of at least one color by using a plurality of photosensitive transistor units, and converting the reference current and the detection current of the light of the at least one color to obtain a corresponding reference voltage value and a detection voltage value of the light of the at least one color; determining a voltage variation amount of the light of the at least one color based on the reference voltage value and the detection voltage value of the light of the at least one color; determining an illumination voltage value of the light of the at least one color based on the voltage variation amount of the light of the at least one color; determining a color temperature compensation weight value of the light of the at least one color by using the illumination voltage value of the light of the at least one color; and compensating a grayscale to be displayed by using the color temperature compensation weight value of the light of the at least one color.

Other aspects may be understood upon reading and understanding of the accompanying drawings and the detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of one or more components in the accompanying drawings do not reflect actual scales and are only intended to illustrate the contents of the present disclosure.

DETAILED DESCRIPTION

Figure 1:
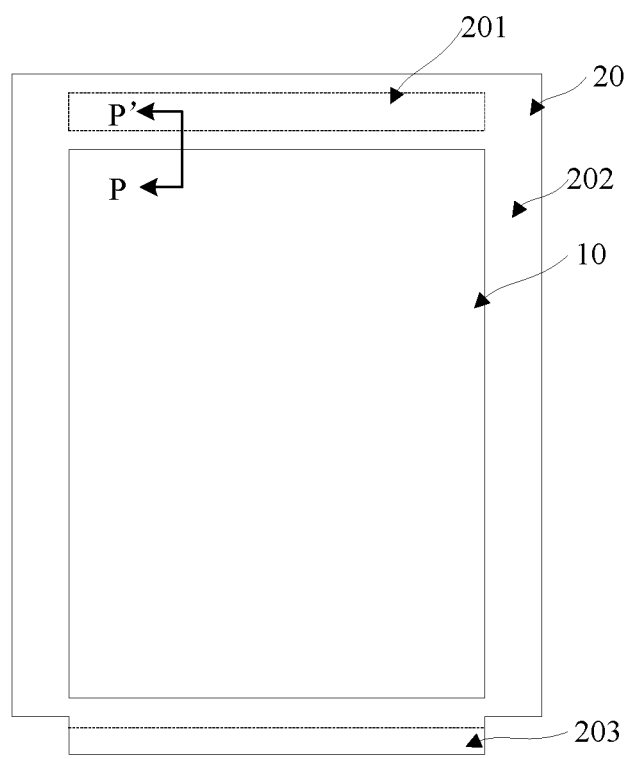
FIG. 1 is a schematic diagram of a display substrate according to at least one embodiment of the present disclosure.

Embodiments of the present disclosure will be described in detail below with reference to the accompanying drawings. Their implementations may be carried out in many different forms. Those of ordinary skill in the art can easily understand such a fact that manners and contents may be transformed into other forms without departing from the purpose and scope of the present disclosure. Therefore, the present disclosure should not be interpreted as being limited to the contents recorded in the following implementations only. The embodiments in the present disclosure and features in the embodiments can be arbitrarily combined with each other if there is no conflict.

In the accompanying drawings, a size of one or more constituent elements, a thickness of a layer or a region is sometimes exaggerated for clarity. Therefore, an implementation of the present disclosure is not necessarily limited to the dimension, and shapes and sizes of one or multiple components in the accompanying drawings do not reflect actual scales. In addition, the accompanying drawings schematically show ideal examples, and an implementation of the present disclosure is not limited to a shape, a numerical value, or the like shown in the accompanying drawings.

Ordinal numerals such as "first", "second", and "third" in the specification are set to avoid confusion of constituent elements, but are not intended to limit in terms of quantity. "Multiple" in the present disclosure means a quantity of two or more.

In the specification, for convenience, wordings indicating directional or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a device or element referred to must have a particular orientation or be constructed and operated in the particular orientation. Therefore, they cannot be construed as limitations on the present disclosure. The positional relationships between the constituent elements may be changed as appropriate according to the directions of the constituent elements described. Therefore, description is not limited to the words and phrases used in the specification, and appropriate substitutions may be made according to situations.

In the specification, unless otherwise specified and defined explicitly, terms "mount", "mutually connect", and "connect" should be understood in a broad sense. For example, it may be a fixed connection, a detachable connection, or an integrated connection, it may be a mechanical connection or a connection, and it may be a direct connection, an indirect connection through an intermediate component, or communication inside two components. For those of ordinary skills in the art, meanings of the abovementioned terms in the present disclosure may be understood according to situations.

In this specification, a transistor refers to an element which at least includes three terminals, i.e., a gate, a drain, and a source. The transistor has a channel region between the drain electrode (drain electrode terminal, drain region, or drain electrode) and the source electrode (source electrode terminal, source region, or source electrode), and a current can flow through the drain electrode, the channel region, and the source electrode. In this specification, the channel region refers to a region which the current mainly flows through.

In this specification, a first electrode may be a drain electrode and a second electrode may be a source electrode, or, a first electrode may be a source electrode and a second electrode may be a drain electrode. In a case that transistors with opposite polarities are used, or in a case that a direction of a current changes during work of a circuit, or the like, functions of the "source electrode" and the "drain electrode" may sometimes be exchanged. Therefore, the "source electrode" and the "drain electrode" may be exchanged in this specification.

In this specification, "connection" includes a case where constituent elements are connected with each other through an element having some electric function. There is no specific restriction on the "element having some electrical function" as long as it may transmit and receive electrical signals between connected constituent elements. Examples of "the element having some electrical function" not only include an electrode and a wiring, but also include a switch element such as a transistor, a resistor, an inductor, a capacitor, and other elements with various functions, etc.

In the specification, "parallel" refers to a state in which an angle formed by two straight lines is above $-10°$ and below $10°$, and thus also includes a state in which the angle is above $-5°$ and below $5°$. In addition, "perpendicular" refers to a state in which an angle formed by two straight lines is above $80°$ and below $100°$, and thus also includes a state in which the angle is above $85°$ and below $95°$.

In the present disclosure, "about" refers to that a boundary is defined not so strictly and numerical values in process and measurement error ranges are allowed.

An embodiment of the present disclosure provides a display substrate, which includes a base substrate, a plurality of photosensitive transistor units, a plurality of photosensitive electrostatic discharge (ESD) protection units and at least one common signal line. The base substrate includes a display region, a peripheral region located at a periphery of the display region, and a binding region located at a side of the display region. The plurality of photosensitive transistor units, the plurality of photosensitive ESD protection units and the at least one common signal line are located in the peripheral region. The plurality of photosensitive transistor units are connected with binding pins in the binding region through a plurality of signal lines, and at least one photosensitive ESD protection unit is connected with, and located between, at least one signal line and the common signal line.

In the display substrate provided in the present embodiment, a photosensitive ESD protection unit connected with a signal line of a photosensitive transistor unit is provided to achieve an ESD protection function on the photosensitive transistor unit.

In some exemplary implementations, the display region is provided with a common signal ESD ring connected with the common signal line. At least one photosensitive ESD protection unit is connected with the common signal ESD ring. In the present exemplary implementation, at least one photosensitive ESD protection unit can be connected with the common signal line through the common signal ESD ring, thereby achieving an ESD protection function and facilitating the arrangement and wiring of the photosensitive ESD protection unit.

In some exemplary implementations, the peripheral region is also provided with a data line ESD protection unit that is connected with the common signal ESD ring in the display region. The plurality of photosensitive transistor units are located at a side of the data line ESD protection unit away from the display region, and at least one photosensitive ESD protection unit is connected with the data line ESD protection unit. In the present exemplary implementation, by arranging the photosensitive transistor units at a side of the data line ESD protection unit away from the display region, an arrangement of the original data line ESD protection unit may be unchanged, and at least one photosensitive ESD protection unit is connected with the common signal line through the data line ESD protection unit, thereby achieving the ESD protection function and facilitating the arrangement of the photosensitive ESD protection unit.

In some exemplary implementations, the peripheral region is provided with a gate drive circuit, and the plurality of signal lines are located at a side of the gate drive circuit close to the display region. In the present exemplary implementation, the signal lines connected with the photosensitive transistor units are arranged at a side of the gate drive circuit close to the display region, so that the gate drive circuit located at an outer side of the signal lines can function in ESD protection to some extent, thereby improving the ESD protection effect.

In some exemplary implementations, the common signal line is located at a side of the gate drive circuit away from the display region. In the present exemplary implementation, the signal lines connected with the photosensitive transistor units are arranged at a side of the gate drive circuit and the common signal line close to the display region, so that the gate drive circuit and the common signal line located at an outer side of the signal lines can function in ESD protection to some extent, thereby improving the ESD protection effect.

In some exemplary implementations, the display substrate further includes a first shading layer located on a side of the plurality of photosensitive transistor units away from the base substrate. The plurality of photosensitive transistor units at least includes a reference transistor unit and a brightness sensing transistor unit. An orthographic projection of the first shading layer on the base substrate contains an orthographic projection of the reference transistor unit on the base substrate, and the orthographic projection of the first shading layer on the base substrate does not overlap or partially overlaps with an orthographic projection of the brightness sensing transistor unit on the base substrate. In some examples, the orthographic projection of the first shading layer on the base substrate does not overlap with an orthographic projection of an active layer of the brightness sensing transistor included in the brightness sensing transistor unit on the base substrate; alternatively, the orthographic projection of the first shading layer on the base substrate does not overlap with an orthographic projection of a partial region of the active layer (e.g., a channel region of the active layer) of the brightness sensing transistor included in the brightness sensing transistor unit on the base substrate. In the present exemplary implementation, the photosensitive transistor units are divided into a reference transistor unit and a brightness sensing transistor unit by using the shading layer, an influence of ambient light on the brightness sensing transistor unit can be determined by comparing a reference current provided by the reference transistor unit with a brightness detection current obtained by the brightness sensing transistor unit, thereby detecting the brightness of the ambient light.

In some exemplary implementations, the reference transistor unit includes a plurality of reference transistors, and the brightness sensing transistor unit includes a plurality of brightness sensing transistors. The plurality of signal lines at least includes a first signal line, a second signal line, a third signal line and a fourth signal line. Gate electrodes of the plurality of reference transistors and the plurality of brightness sensing transistors are connected with the first signal line, first electrodes of the plurality of reference transistors and the plurality of brightness sensing transistors are connected with the second signal line, second electrodes of the plurality of reference transistors are connected with the third signal line, and second electrodes of the plurality of brightness sensing transistors are connected with the fourth signal line. In the present exemplary implementation, the first signal line may provide a gate control signal, the second signal line may provide a trigger voltage, the third signal line may output a reference current detected by the reference transistor unit, and the fourth signal line may output a brightness detection current obtained by the brightness sensing transistor unit.

In some exemplary implementations, the plurality of photosensitive ESD protection units include a first photosensitive ESD protection unit, a second photosensitive ESD protection unit, a third photosensitive ESD protection unit, and a fourth photosensitive ESD protection unit. The first signal line is connected with the first photosensitive ESD protection unit, the second signal line is connected with the second photosensitive ESD protection unit, the third signal line is connected with the third photosensitive ESD protection unit, and the fourth signal line is connected with the fourth photosensitive ESD protection unit. The first photosensitive ESD protection unit and the second photosensitive ESD protection unit are located at a side of the plurality of photosensitive transistor units away from the display region, and the third photosensitive ESD protection unit and the fourth photosensitive ESD protection unit are located at a side of the plurality of photosensitive transistor units close to the display region. In the present exemplary implementation, each signal line is connected with a photosensitive ESD protection unit, so that a good ESD protection effect can be achieved.

In some exemplary implementations, the first photosensitive ESD protection unit and the second photosensitive ESD protection unit are directly connected with the common signal line. The third photosensitive ESD protection unit and the fourth photosensitive ESD protection unit are connected with the common signal ESD ring in the display region. In the present exemplary implementation, the photosensitive ESD protection unit may be directly connected with the common signal line or may be connected with the common signal ESD ring nearby, thereby facilitating wiring of the photosensitive ESD protection unit and achieving a good ESD protection effect.

In some exemplary implementations, the display substrate further includes a first color filter layer located in the peripheral region and on a side of the plurality of photosensitive transistor units away from the base substrate. The first color filter layer includes a first filter unit, a second filter unit, a third filter unit, a light transmission unit and a shading unit. The plurality of photosensitive transistor units includes a brightness sensing transistor unit, a reference transistor unit, a first color photosensitive transistor unit, a second color photosensitive transistor unit, and a third color photosensitive transistor unit. An orthographic projection of the first filter unit on the base substrate contains an orthographic projection of the first color photosensitive transistor unit on the base substrate, an orthographic projection of the second filter unit on the base substrate contains an orthographic projection of the second color photosensitive transistor unit on the base substrate, an orthographic projection of the third filter unit on the base substrate contains an orthographic projection of the third color photosensitive transistor unit on the base substrate, an orthographic projection of the light transmission unit on the base substrate contains an orthographic projection of the brightness sensing transistor unit on the base substrate, and an orthographic projection of the shading unit on the base substrate contains an orthographic projection of the reference transistor unit on the base substrate. In the present exemplary implementation, color temperature detection and brightness detection of different colors can be performed by using a plurality of photosensitive transistor units, and then color temperature compensation can be performed to improve the display effect.

In some exemplary implementations, the display substrate further includes a second color filter layer located in the display region. The second color filter layer and the first color filter layer are located in the same layer. However, the present embodiment is not limited thereto.

In some exemplary implementations, the display substrate further includes a second color filter layer located in the display region. In a plane perpendicular to the display substrate, a distance from the first color filter layer to the photosensitive transistor unit is smaller than a distance from the second color filter layer to the photosensitive transistor unit. In the present disclosure, in a plane perpendicular to the display substrate, the distance from A to B may refer to a perpendicular distance between a surface of A close to B and a surface of B close to A.

In some exemplary implementations, the first color photosensitive transistor unit includes a plurality of first color photosensitive transistors, the second color photosensitive transistor unit includes a plurality of second color photosensitive transistors, the third color photosensitive transistor unit includes a plurality of third color photosensitive transistors, the brightness sensing transistor unit includes a plurality of brightness sensing transistors, and the reference transistor unit includes a plurality of reference transistors. The plurality of signal lines includes a fifth signal line, a sixth signal line, a seventh signal line, an eighth signal line, a ninth signal line, a tenth signal line, an eleventh signal line, and a twelfth signal line. Gate electrodes of the plurality of first color photosensitive transistors, the plurality of second color photosensitive transistors and the plurality of third color photosensitive transistors are connected with the fifth signal line. Gate electrodes of the plurality of brightness sensing transistors and the plurality of reference transistors are connected with the sixth signal line. First electrodes of the plurality of first color photosensitive transistors, the plurality of second color photosensitive transistors, the plurality of third color photosensitive transistors, the plurality of brightness sensing transistors and the plurality of reference transistors are connected with the seventh signal line. Second electrodes of the plurality of first color photosensitive transistors are connected with the eighth signal line. Second electrodes of the plurality of second color photosensitive transistors are connected with the ninth signal line. Second electrodes of the plurality of third color photosensitive transistors are connected with the tenth signal line. Second electrodes of the plurality of brightness sensing transistors are connected with the eleventh signal line. Second electrodes of the plurality of reference transistors are connected with the twelfth signal line. In the present exemplary implementation, the fifth signal line may provide a first gate control signal, the sixth signal line may provide a second gate control signal, the seventh signal line may provide a trigger voltage, the eighth signal line may output a first color detection current sensed by the first color photosensitive transistor unit, the ninth signal line may output a second color detection current sensed by the second color photosensitive transistor unit, the tenth signal line may output a third color detection current sensed by the third color photosensitive transistor unit, the twelfth signal line may output a reference current sensed by the reference transistor unit, and the eleventh signal line may output a brightness detection current obtained by the brightness sensing transistor unit. The brightness of the display substrate can be adjusted by using the brightness detection current and the reference current, and the display color temperature can be compensated by using the first color detection current, the second color detection current, the third color detection current and the reference current, thereby improving the display effect.

In some exemplary implementations, each of the fifth to twelfth signal lines is connected with one photosensitive ESD protection unit. In the present exemplary implementation, each signal line is connected with a photosensitive ESD protection unit, so that a good ESD protection effect can be achieved.

In some exemplary embodiments, the quantity of the first color photosensitive transistors included in the first color photosensitive transistor unit, the quantity of the second color photosensitive transistors included in the second color photosensitive transistor unit, and the quantity of the third color photosensitive transistors included in the third color photosensitive transistor unit are the same. The quantity of the brightness sensing transistors included in the brightness sensing transistor unit is the same as the quantity of the reference transistors included in the reference transistor unit. However, the present embodiment is not limited thereto.

In some exemplary embodiments, the quantity of the first color photosensitive transistors included in the first color photosensitive transistor unit is different from the quantity of the brightness sensing transistors included in the brightness sensing transistor unit. However, the present embodiment is not limited thereto. For example, the quantity of the first color photosensitive transistors included in the first color photosensitive transistor unit is the same as the quantity of the brightness sensing transistors included in the brightness sensing transistor unit.

In some exemplary implementations, in a plane perpendicular to the display substrate, the display substrate includes a first conductive layer, a semiconductor layer and a second conductive layer sequentially arranged on the base substrate. The first conductive layer at least includes gate electrodes of the transistors in the photosensitive transistor unit, the semiconductor layer at least includes active layers of the transistors in the photosensitive transistor unit, and the second conductive layer at least includes first electrodes and second electrodes of the transistors in the photosensitive transistor unit.

In some possible implementations, the display substrate further includes a first transparent conductive layer and a second transparent conductive layer. The first transparent conductive layer is located between the semiconductor layer and the second conductive layer, and the first transparent conductive layer at least includes a plurality of pixel electrodes. The second transparent conductive layer is located on a side of the second conductive layer away from the base substrate and the second transparent conductive layer at least includes a plurality of common electrodes. The display substrate according to the present exemplary embodiment can be a LCD display substrate. However, the present embodiment is not limited thereto.

The display substrate of the present embodiment will be described below through some examples.

FIG. 1 is a schematic diagram of a display substrate according to at least one embodiment of the present disclosure. As shown in FIG. 1, the display substrate of the present embodiment includes a display region 10 and a non-display region 20. The non-display region 20 includes a peripheral region 202 surrounding the display region 10 and a binding region 203 located at a side of the display region 10. The peripheral region 202 includes a photosensitive region 201 located at a side of the display region 10. In some examples, the photosensitive region 201 and the binding region 203 are located at opposite sides (e.g. upper side and lower side) of the display region 10. In some examples, the photosensitive region 201 may be located at a side of the display region 10 away from the binding region 203. However, a location of the photosensitive region is not limited in the present embodiment. For example, the photosensitive region may be located between the display region and the binding region.

In some exemplary implementations, as shown in FIG. 1, the display region 10 may be rectangular, the photosensitive region 201 may be rectangular, and the binding region 203 may be rectangular. However, shapes of the display region, the photosensitive region and the binding region are not limited in the present embodiment.

In some exemplary implementations, the peripheral region 202 is provided with a plurality of photosensitive transistor units, a plurality of photosensitive ESD protection units and at least one common signal line. The plurality of photosensitive transistor units is connected with binding pins in the binding region 203 through a plurality of signal lines. At least one photosensitive ESD protection unit is connected with, and located between, at least one signal line and the common signal line. In the present exemplary implementation, the photosensitive transistor unit can achieve an ESD protection effect by connecting with the photosensitive ESD protection unit.

In some exemplary implementations, the plurality of photosensitive transistor units is arranged in the photosensitive region 201 at a side of the display region 10 away from the binding region 203. In an example where the display substrate is applied in a hand-held display product, the user will not block the photosensitive region 201 above the display region 10 when using the display product, so that the photosensitive transistor unit in the photosensitive region 201 can receive ambient light to perform ambient light detection. In addition, since the photosensitive region 201 is away from the binding region 203, a risk of coupling between a trace entering the display region 10 for transmitting a display signal and the photosensitive transistor unit can be avoided, and the mutual influence between the photosensitive region 201 and the display region 10 can be avoided.

In some exemplary implementations, the display substrate may be an LCD display substrate. However, the present embodiment is not limited thereto. For example, the display substrate may be an OLED display substrate or a QLED display substrate or other types of display substrates.

Figure 2:
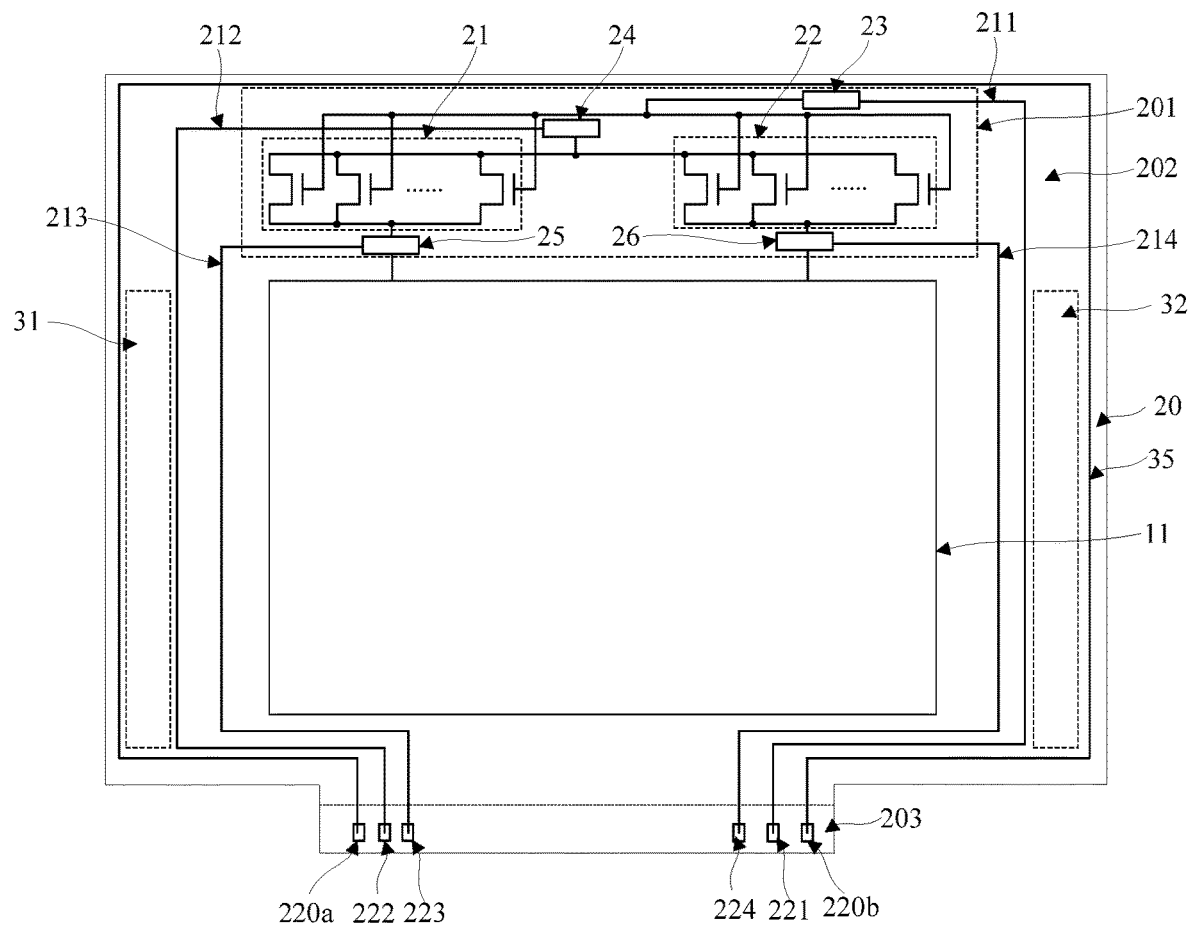
FIG. 2 is a diagram of an example structure of a display substrate according to at least one embodiment of the present disclosure.

Following description is based on an example that the display substrate is an LCD display substrate. FIG. 2 is a diagram of an example structure of a display substrate according to at least one embodiment of the present disclosure.

In some exemplary implementations, the display region 10 may be provided with a plurality of gate lines and a plurality of data lines, and the plurality of gate lines and the plurality of data lines may cross to define a plurality of sub-pixel regions. A pixel electrode, a common electrode and a pixel drive circuit connected with the pixel electrode may be provided in each sub-pixel region. The pixel drive circuit may include at least one thin film transistor. For example, a drain electrode of the thin film transistor may be electrically connected with the pixel electrode, a source electrode of the thin film transistor may be electrically connected with a data line, and a gate electrode of the thin film transistor may be electrically connected with a gate line. The on/off of the thin film transistor is controlled by a scan signal transmitted by the gate line, and a pixel voltage transmitted by the data line is output to the pixel electrode through the pixel drive circuit. The common electrode is connected with the common signal line. An electric field for driving liquid crystal molecules to deflect is formed between the pixel electrode and the common electrode, thereby achieving the display of a specific grayscale.

In some exemplary implementations, as shown in FIG. 1 and FIG. 2, the peripheral region 202 may be provided with a first gate drive circuit 31, a second gate drive circuit 32 and a common signal line 35. For example, the first gate drive circuit 31 and the second gate drive circuit 32 may be arranged within the peripheral region 202 at opposite sides of the display region 10. The first gate drive circuit 31 and the second gate drive circuit 32 may provide scan signals to gate lines within the display region 10. However, the present embodiment is not limited thereto. In some examples, the gate drive circuit may be provided within the peripheral region 202 at one side of the display region 10 only.

In some exemplary implementations, the common signal line 35 may be a signal line that provides a common voltage. The common signal line 35 may surround three sides of the display region 10 and extend to the binding region 203 and be connected with common signal pins 220a and 220b in the binding region 203. However, the present embodiment is not limited thereto. In some examples, the common signal line 35 may be a ground signal line which may be connected with a ground pin within the binding region 203.

In some exemplary implementations, the binding region 203 may be provided with elements such as a source drive circuit, a drive control chip, and binding pins. The source drive circuit may provide pixel voltages to data lines in the display region 10 and the drive control chip may provide control signals to the source drive circuit and the gate drive circuit. A plurality of binding pins may be bound to a Flexible Printed Circuit (FPC) such that a plurality of signal lines (e.g., drive control lines and power supply lines) is connected with an external control device through the plurality of binding pins. However, the present embodiment is not limited thereto.

In some exemplary implementations, as shown in FIG. 2, the plurality of photosensitive transistor units in the photosensitive region 201 include a reference transistor unit 21 and a brightness sensing transistor unit 22. The reference transistor unit 21 may include a plurality of reference transistors, and the brightness sensing transistor unit 22 may include a plurality of brightness sensing transistors. In some examples, the plurality of reference transistors within the reference transistor unit 21 may be arranged in sequence (e.g. in a row) in the horizontal direction; the plurality of brightness sensing transistors within the brightness sensing transistor unit 22 may be arranged in sequence (e.g. in a row) in the horizontal direction. However, the present embodiment is not limited thereto. For example, the plurality of reference transistors may be arranged in a plurality of rows and columns, and the plurality of brightness sensing transistors may be arranged in a plurality of rows and columns.

In some exemplary implementations, an orthographic projection of the reference transistor on the base substrate may not overlap with an orthographic projection of the brightness sensing transistor on the base substrate. The reference transistor and the brightness sensing transistor can be prepared simultaneously. For example, active layers of the reference transistor and the brightness sensing transistor are located in the same layer, gate electrodes of the reference transistor and the brightness sensing transistor are located in the same layer, and first electrodes and second electrodes of the reference transistor and the brightness sensing transistor are located in the same layer. The present exemplary implementation can reduce the number of times of a patterning process, and the reference transistor and the brightness sensing transistor, except for different reception of ambient light, have high consistency in other light receiving conditions, so that detection accuracy can be improved.

In some exemplary implementations, the reference transistor and the brightness sensing transistor may be aligned in a first direction. The first direction may be a horizontal direction (e.g. parallel to the sub-pixel row direction) or a vertical direction (e.g. parallel to the sub-pixel column direction). However, the present embodiment is not limited thereto.

In some exemplary implementations, the quantity of rows of reference transistors included in the reference transistor unit may be the same as the quantity of rows of brightness sensing transistors included in the brightness sensing transistor unit, and the quantity of columns of reference transistors included in the reference transistor unit may be the same as the quantity of columns of brightness sensing transistors included in the brightness sensing transistor unit. However, the present embodiment is not limited thereto. For example, the quantity of rows of the reference transistors may be different from the quantity of rows of the brightness sensing transistors, or, the quantity of columns of the reference transistors may be different from the quantity of columns of the brightness sensing transistors.

In some exemplary implementations, the reference transistor unit and the brightness sensing transistor unit may be symmetrical with respect to an axis of the display substrate (e.g. a central axis of the display substrate in the row direction). However, the present embodiment is not limited thereto.

In some exemplary implementations, an arrangement density of transistors within the photosensitive region 201 along the row direction may be greater than an arrangement density of transistors within the display region 10 along the row direction; alternatively, an arrangement density of transistors in the photosensitive region 201 along the column direction may be greater than an arrangement density of transistors in the display region 10 along the column direction. Herein, the arrangement density of transistors along the row direction may be the quantity of transistors arranged within a unit length along the row direction in the display substrate, and the arrangement density of transistors along the column direction may be the quantity of transistors arranged within a unit length along the column direction in the display substrate. The present exemplary implementation can increase an effective photosensitive area within a unit area of the display substrate, avoid increasing a size of the peripheral region, and ensure a strength of the detection signal. However, the present embodiment is not limited thereto.

In some exemplary implementations, an arrangement density of transistors of the reference transistor unit along the row direction may be equal to an arrangement density of transistors of the brightness sensing transistor unit along the row direction; alternatively, an arrangement density of transistors of the reference transistor unit along the column direction may be equal to an arrangement density of transistors of the brightness sensing transistor unit along the column direction. The exemplary implementation can improve a consistency of the reference transistor unit and the brightness sensing transistor unit during the manufacturing process, avoid a difference in actual patterning caused by a difference in density between the reference transistor unit and the brightness sensing transistor unit, thereby improving detection accuracy.

In some exemplary implementations, the reference transistor unit 21 may be shaded by a first shading layer of the display substrate; at least a portion of an active layer of the brightness sensing transistor of the brightness sensing transistor unit 22 is not shaded by the first shading layer, and a brightness of ambient light where the display substrate is located can be sensed. In other words, an orthographic projection of the first shading layer of the display substrate on the base substrate may contain an orthographic projection of the reference transistor unit 21 on the base substrate, and the orthographic projection of the first shading layer on the base substrate and an orthographic projection of the active layer of the brightness sensing transistor included in the brightness sensing transistor unit 22 on the base substrate have an at least partially non-overlapping region. The first shading layer of the display substrate may be located on a side of the reference transistor unit away from the base substrate to prevent the reference transistor unit from receiving ambient light. In the present exemplary implementation, the ambient light variation is reflected through sensing results of the two photosensitive transistor units. Noise interference is removed by an operation on the sensing results of the reference transistor unit and the brightness sensing transistor unit.

In some exemplary implementations, when the display substrate is an LCD display substrate and the display substrate employs a backlight source, in order to prevent the photosensitive transistor units from being affected by the backlight source illumination, a second shading layer may be provided on a display side of the photosensitive transistor units away from the display substrate. For example, an orthographic projection of the second shading layer on the base substrate contains an orthographic projection of the photosensitive transistors unit on the base substrate to prevent light from the backlight source from irradiating the photosensitive transistor units. In some examples, an additional film layer may be added to prepare the second shading layer, or a film layer of a transistor structure of the photosensitive transistor units may be reused as the second shading layer, thereby simplifying a structure and a preparation process of the photosensitive transistor unit.

Figure 3:
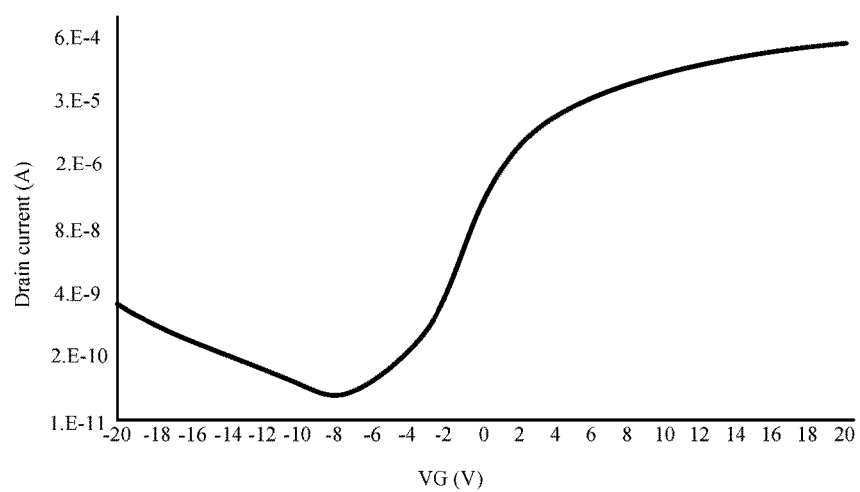
FIG. 3 is a schematic diagram of a voltage and current curve of a semiconductor.
Figure 4:
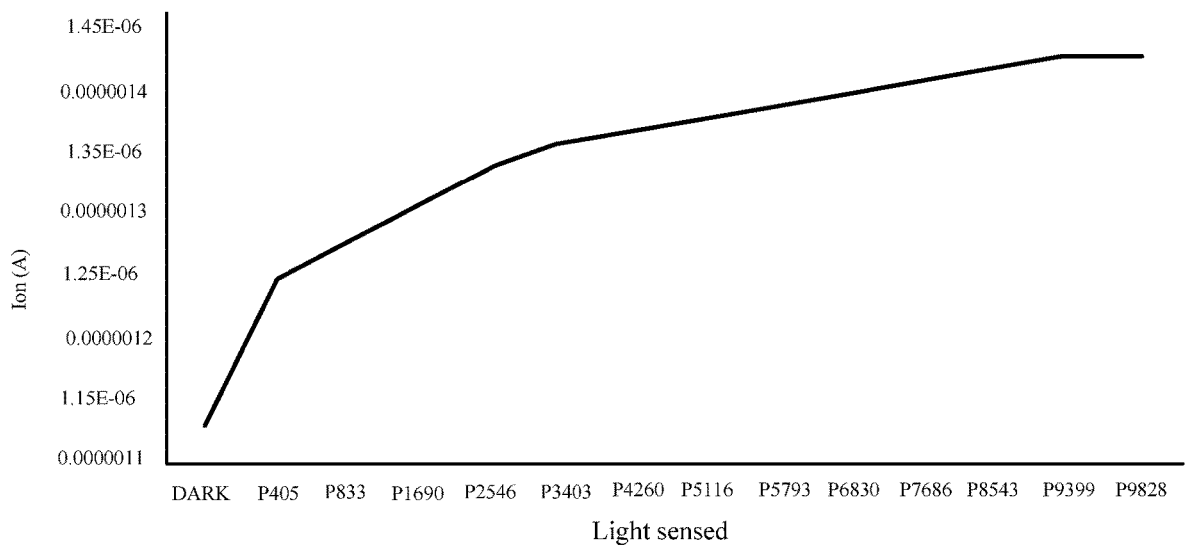
FIG. 4 is a schematic diagram of a curve of an on-state current of a transistor varying with light sensed.

In some exemplary implementations, an electricity conduction principle of a transistor included in the photosensitive transistor unit is that a current is formed by accelerated drift motion of free electrons and holes under an action of an orientated electric field, and when light irradiates the photosensitive transistor, the holes and free electrons receive photon energy, carrier mobility increases, and a weak current is generated. An intensity of the ambient light can be determined according to a magnitude of the current. A transistor included in the photosensitive transistor unit may be a current-limiting Metal-Oxide-Semiconductor Field-Effect Transistor (MOSFET) having a gate, a source and a drain, wherein a gate voltage can control a magnitude of a current flowing from the source to the drain. When the transistor is working, if an appropriate voltage is applied to the gate and source of the transistor, a current (divided into an off-state current $I_{off}$ and an on-state current $I_{on}$) will be formed in the active layer. FIG. 3 is a graph of a voltage and current curve of a semiconductor. If a gate voltage and a source voltage of the transistor are kept unchanged and the active layer made of a semiconductor material is irradiated, the current in the active layer will change. The transistor can detect a magnitude of the current flowing through by an intensity level of light. For example, if the transistor is located in a dark space (that is, no illumination is received), the transistor can only allow a small current to flow through; when the transistor detects a bright light, a larger current will be allowed to flow through. In this example, since an off-state current $I_{off}$ of the transistor is too small (for example, about $10^{-11}$ A), it is difficult to be collected by a chip for display. Therefore, it is selected to apply voltage to ensure that the transistor works under an on-state. However, the current in the on-state linear interval changes too fast and is difficult to be controlled stably, thus optical characteristics of the transistor working in a saturation state are selected to affect the on-state current $I_{on}$, and the on-state current $I_{on}$ is sampled and conducted to establish a characteristic curve related to the light intensity, so as to realize the sensing of the optical characteristics. FIG. 4 is a schematic diagram of a curve of an on-state current of a transistor varying with light sensed. As shown in FIG. 4, the on-state current has a large current value under a strong irradiation of light, which is easy to be sampled, and the current region is gentle and easy to control in the saturation region. In some examples, in order to ensure that the transistor is in the on-state and working in the saturation region, the gate voltage and the source voltage of the transistor are selected to be greater than a threshold voltage $V_{th}$, for example, referring to FIG. 3, they may be selected to be greater than 5V, e.g., be 10V. However, the present embodiment is not limited thereto.

In some exemplary implementations, a width-to-length ratio of a channel region of the transistor may be designed to be less than or equal to 5/4. Herein, a size of the channel region of an active layer of the transistor in the row direction is a length of the channel region, and a size of the channel region in the column direction is a width of the channel region. In some examples, the plurality of transistors included in the photosensitive transistor unit may be located in the same row, so that the size of the channel region of the photosensitive transistor unit in the column direction may be less than or equal to 5 microns, much less than a size of a sub-pixel in the column direction (e.g., about 30 microns). The channel region of the active layer of the transistor is a gap portion of the corresponding active layer between the first electrode and the second electrode. In the present exemplary implementation, the portion of the photosensitive transistor unit that is not shaded from light may be only the channel region, so that a bright line problem due to reflection of light can be avoided.

In some exemplary implementations, as shown in FIG. 2, the gate electrodes of the plurality of reference transistors and the plurality of brightness sensing transistors are connected with a first signal line 211, the first electrodes of the plurality of reference transistors and the plurality of brightness sensing transistors are connected with a second signal line 212, the second electrodes of the plurality of reference transistors are connected with a third signal line 213, and the second electrodes of the plurality of brightness sensing transistors are connected with a fourth signal line 214. The first signal line 211, the second signal line 212, the third signal line 213 and the fourth signal line 214 extend to the binding region 203. For example, the first signal line 211 is connected with a first binding pin 221 in the binding region 203, the second signal line 212 is connected with a second binding pin 222 in the binding region 203, the third signal line 213 is connected with a third binding pin 223 in the binding region 203, and the fourth signal line 214 is connected with a fourth binding pin 224 in the binding region 203. The first signal line 211 may provide a gate control signal to the reference transistor and the brightness sensing transistor, the second signal line 212 may provide a trigger voltage signal to the reference transistor and the brightness sensing transistor; the third signal line 213 may output a reference current generated by the reference transistor, and the fourth signal line 214 may output a brightness detection current generated by the brightness sensing transistor.

In some exemplary implementations, as shown in FIG. 2, the first signal line 211, the second signal line 212, the third signal line 213, and the fourth signal line 214 are located at a side of the first gate drive circuit 31 and the second gate drive circuit 32 close to the display region 10 in the peripheral region 202. For example, the first signal line 211 and the fourth signal line 214 are located at a side of the second gate drive circuit 32 close to the display region 10, and the second signal line 212 and the third signal line 213 are located at a side of the first gate drive circuit 31 close to the display region 10. However, the present embodiment is not limited thereto. For example, the first signal line 211 to the fourth signal line 214 may all be located between the first gate drive circuit 31 and the display region 10, or may all be located between the second gate drive circuit 32 and the display region 10. In the present exemplary implementation, the gate drive circuit and the common signal line may be used to block a portion of ESD to achieve ESD protection for the first signal line 211 to the fourth signal line 214.

In some exemplary implementations, as shown in FIG. 2, the peripheral region 202 is further provided with a plurality of photosensitive ESD protection units. The photosensitive ESD protection units are located at a periphery of the photosensitive transistor units. In some examples, the plurality of photosensitive ESD protection units may all be located in the photosensitive region 201, or a portion of the plurality of photosensitive ESD protection units may be located in the photosensitive region 201 and the remaining may be located outside the photosensitive region 201. Positions of the photosensitive ESD protection units are not limited in the present embodiment.

In some exemplary implementations, as shown in FIG. 2, the plurality of photosensitive ESD protection units include a first photosensitive ESD protection unit 23, a second photosensitive ESD protection unit 24, a third photosensitive ESD protection unit 25, and a fourth photosensitive ESD protection unit 26. The first photosensitive ESD protection unit 23 is connected with the first signal line 211, the second photosensitive ESD protection unit 24 is connected with the second signal line 212, the third photosensitive ESD protection unit 25 is connected with the third signal line 213, and the fourth photosensitive ESD protection unit 26 is connected with the fourth signal line 214. The first photosensitive ESD protection unit 23 and the second photosensitive ESD protection unit 24 are located at a side of the photosensitive transistor units away from the display region 10, and the third photosensitive ESD protection unit 25 and the fourth photosensitive ESD protection unit 26 are located at a side of the photosensitive transistor units close to the display region 10. For example, the first photosensitive ESD protection unit 23 is located at a side of the brightness sensing transistor unit 22 away from the display region 10, the second photosensitive ESD protection unit 24 is located at a side of the reference transistor unit 21 away from the display region 10, the third photosensitive ESD protection unit 25 is located at a side of the reference transistor unit 21 close to the display region 10, and the fourth photosensitive ESD protection unit 26 is located at a side of the brightness sensing transistor unit 22 close to the display region 10. In some examples, the first photosensitive ESD protection unit 23 and the second photosensitive ESD protection unit 24 may be directly connected with the common signal line 35 arranged within the peripheral region 202, and the third photosensitive ESD protection unit 25 and the fourth photosensitive ESD protection unit 26 may be connected with a common signal ESD ring 11 in the display region 10 to achieve a connection with the common signal line 35. In some examples, the common signal ESD ring 11 may be a trace or electrode (e.g., a common electrode of an entire surface) arranged in the display region 10 and having the same potential as the common signal line 35, and the common signal ESD ring 11 may be connected with the common signal line 35 in the peripheral region 202. In the present exemplary implementation, the ESD protection function can be maximized by connecting the photosensitive ESD protection unit to the common signal ESD ring.

Figure 5:
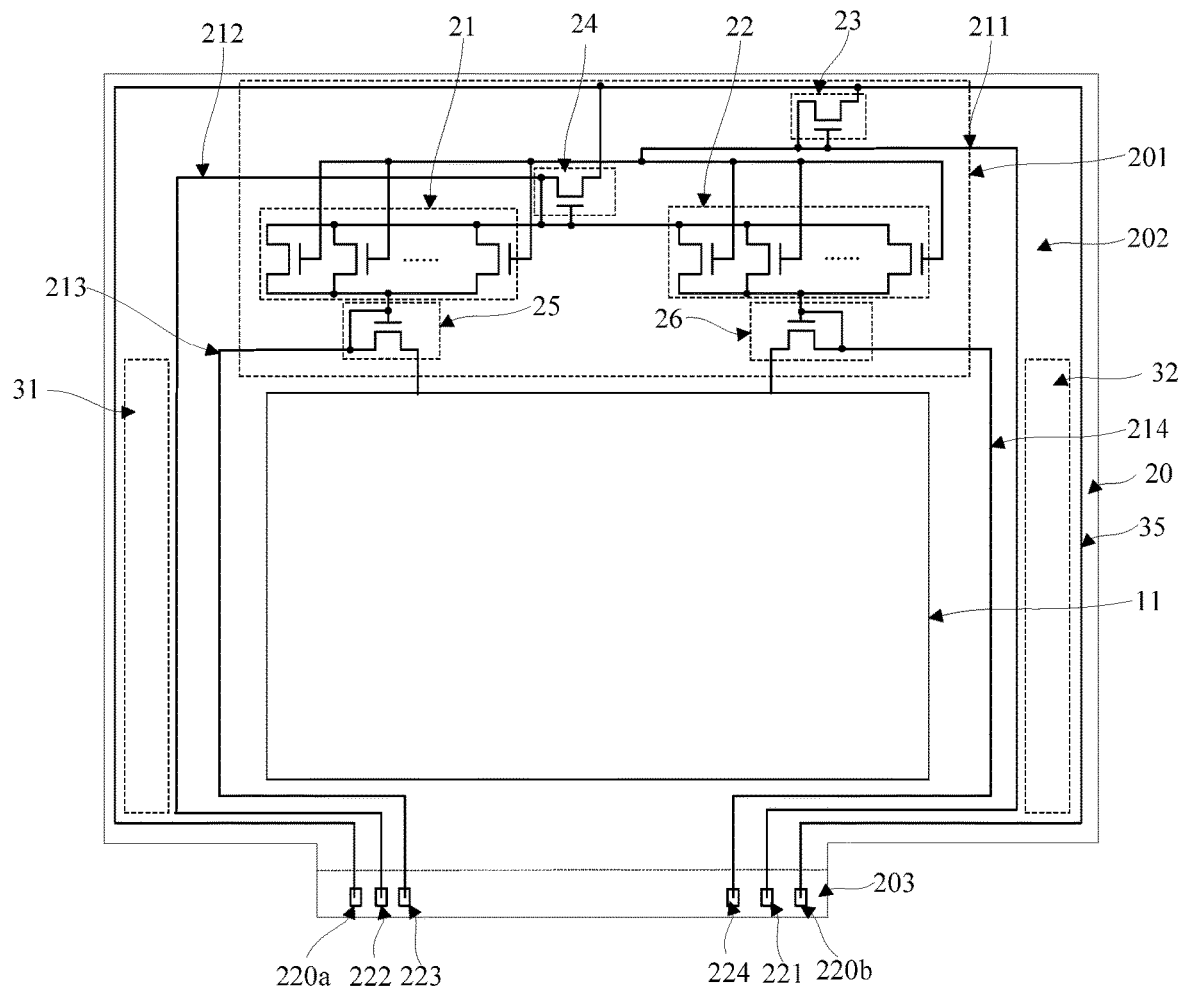
FIG. 5 is a schematic diagram of a structure of a photosensitive ESD protection unit according to at least one embodiment of the present disclosure.

FIG. 5 is a diagram of an example structure of a photosensitive ESD protection unit according to at least one embodiment of the present disclosure. In some exemplary implementations, as shown in FIG. 5, the first photosensitive ESD protection unit 23, the second photosensitive ESD protection unit 24, the third photosensitive ESD protection unit 25, and the fourth photosensitive ESD protection unit 26 each include one ESD protection transistor. A gate electrode and a first electrode of the ESD protection transistor of the first photosensitive ESD protection unit 23 are connected with the first signal line 211, and a second electrode of the ESD protection transistor of the first photosensitive ESD protection unit 23 is connected with the common signal line 35. A gate electrode and a first electrode of the ESD protection transistor of the second photosensitive ESD protection unit 24 are both connected with the second signal line 212, and a second electrode of the ESD protection transistor of the second photosensitive ESD protection unit 24 is connected with the common signal line 35. A gate electrode and a first electrode of the ESD protection transistor of the third photosensitive ESD protection unit 25 are both connected with the third signal line 213, and a second electrode of the ESD protection transistor of the third photosensitive ESD protection unit 25 is connected with the common signal ESD ring 11. A gate electrode and a first electrode of the ESD protection transistor of the fourth photosensitive ESD protection unit 26 are both connected with the fourth signal line 214, and a second electrode of the ESD protection transistor of the fourth photosensitive ESD protection unit 26 is connected with the common signal ESD ring 11. In the present exemplary implementation, the photosensitive ESD protection unit can be used for ESD protection to improve the ESD protection effect of the photosensitive transistor.

Figure 6:
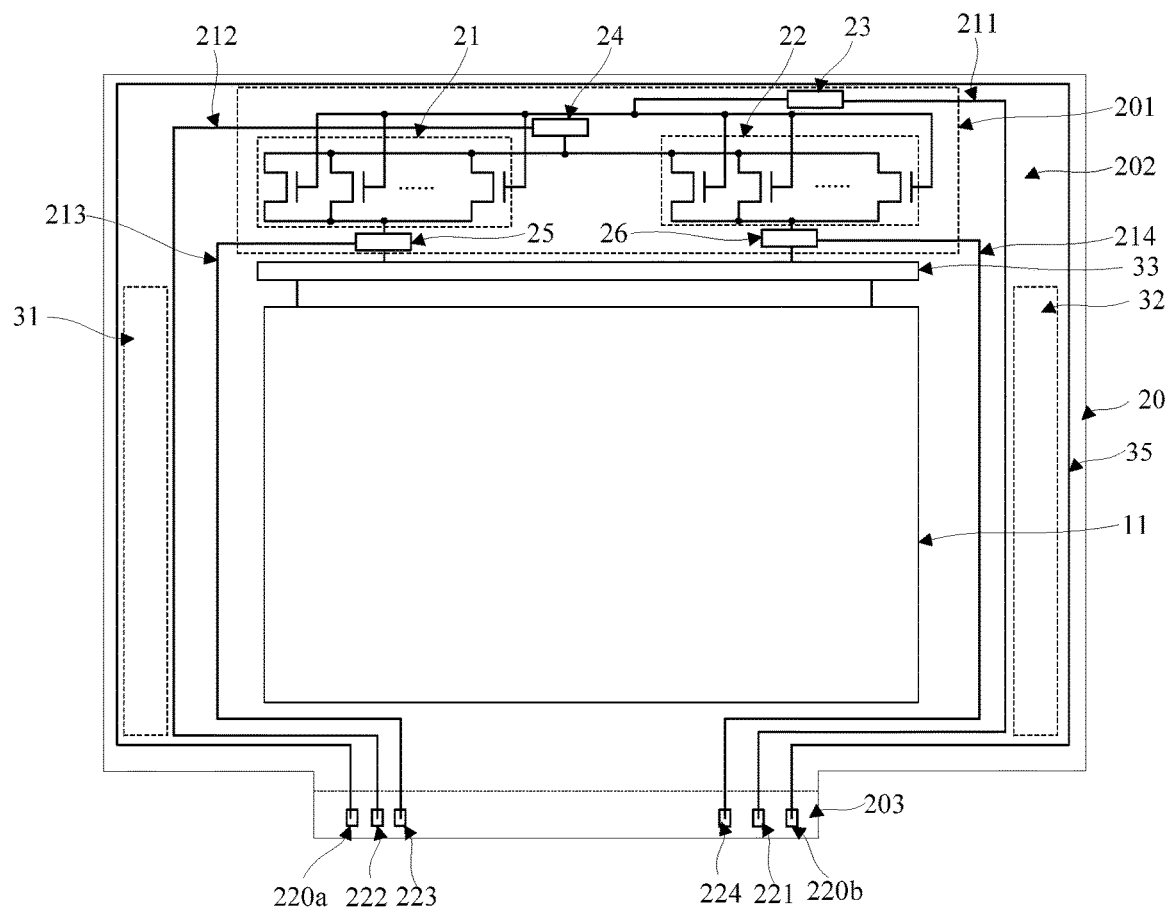
FIG. 6 is a diagram of another example structure of a display substrate according to at least one embodiment of the present disclosure.

FIG. 6 is a diagram of another example structure of a display substrate according to at least one embodiment of the present disclosure. In some exemplary implementations, as shown in FIG. 6, the peripheral region 202 is further provided with a data line ESD protection unit 33. The data line ESD protection unit 33 is located between the display region 10 and the photosensitive region 201. The data line ESD protection unit 33 is connected with the common signal ESD ring 11 in the display region 10. The third photosensitive ESD protection unit 25 and the fourth photosensitive ESD protection unit 26 connected with the photosensitive transistor units in the photosensitive region 201 may be connected with the data line ESD protection unit 33 to achieve a connection with the common signal line 35 to provide an ESD release path. In the present exemplary implementation, the photosensitive ESD protection unit achieves the ESD protection function by connecting with the data line ESD protection unit. However, the present embodiment is not limited thereto. The description for remaining structures of the display substrate of the present embodiment may refer to the description in the foregoing embodiments, and thus will not be repeated here.

In some exemplary implementations, for the display substrate shown in FIG. 2, the display substrate may first be placed in a reference environment with a brightness of 0, a first reference current P1 in the reference environment is collected by using the reference transistor unit, and a first brightness detection current P2 in the reference environment is collected by using the brightness sensing transistor unit. When a user uses the display substrate subsequently, in an actual environment, a second reference current P3 in the actual environment can be collected by using the reference transistor unit, and a second brightness detection current P4 in the actual environment can be collected by using the brightness sensing transistor unit. Subsequently, the display substrate can automatically adjust the screen brightness based on a parameter X, wherein the parameter $X=P4-P3-(P2-P1)$. However, the present embodiment is not limited thereto.

Figure 7:
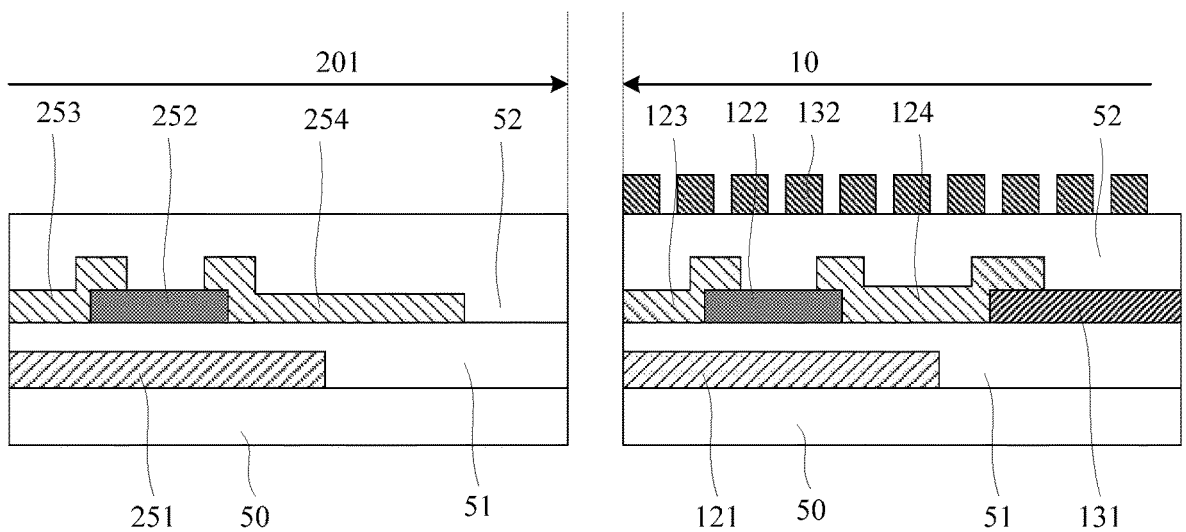
FIG. 7 and FIG. 8 are schematic diagrams of a partial section of a display substrate according to at least one embodiment of the present disclosure.
Figure 8:
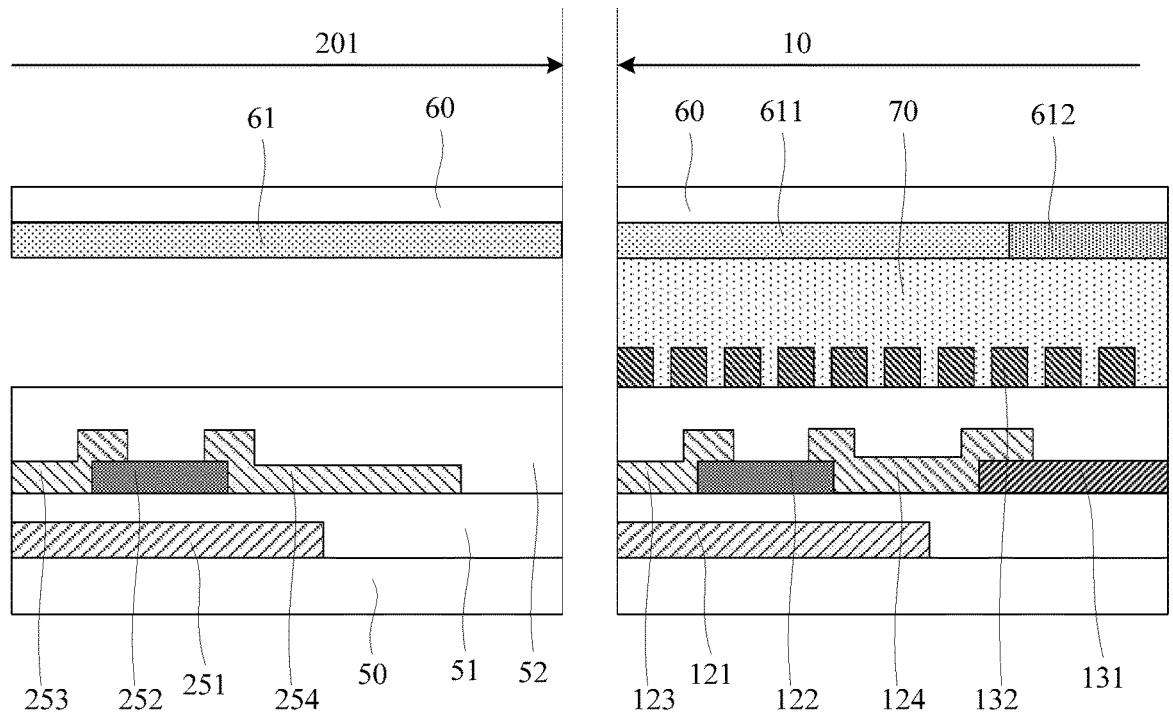

FIG. 7 and FIG. 8 are schematic diagrams of a partial section of a display substrate according to at least one embodiment of the present disclosure. FIG. 7 and FIG. 8 are schematic diagrams of a partial section taken along P-P' direction in FIG. 1. In FIG. 7 and FIG. 8, one photosensitive transistor in the photosensitive region 201 and one transistor for display in the display region 10 are illustrated as examples.

In some exemplary implementations, as shown in FIG. 7, in a plane perpendicular to the display substrate, the display substrate may include a first conductive layer, a semiconductor layer, a transparent conductive layer, a second conductive layer, and a second transparent conductive layer sequentially arranged on the base substrate 50. The first conductive layer at least includes a gate electrode 251 of the photosensitive transistor located in the photosensitive region 201 and a gate electrode 121 of the transistor for display located in the display region 10. The semiconductor layer at least includes an active layer 252 of the photosensitive transistor located in the photosensitive region 201 and an active layer 122 of the transistor for display located in the display region 10. The second conductive layer at least includes a first electrode 253 and a second electrode 254 of the photosensitive transistor located in the photosensitive region 201, and a first electrode 123 and a second electrode 124 of the transistor for display located in the display region 10. The first transparent conductive layer at least includes a pixel electrode 131 in the display region 10. The second transparent conductive layer at least includes a common electrode 132 in the display region 10. A first insulating layer 51 is provided between the first conductive layer and the semiconductor layer, and a second insulating layer 52 is provided between the second conductive layer and the second transparent conductive layer. The first insulating layer may also be called a gate insulating (GI) layer, and the second insulating layer may also be called a passivation (PVX) layer.

In some exemplary implementations, the first insulating layer 51 and the second insulating layer 52 may be made of any one or more of silicon oxide (SiOx), silicon nitride (SiNx), and silicon oxynitride (SiON), and may be a single layer, multiple layers, or a composite layer. The semiconductor layer may be made of one or more of silicon (Si), amorphous silicon (a-Si), polysilicon (p-Si), hexathiophene, polythiophene, and the like, that is, the present disclosure is applicable to transistors manufactured based on silicon technology and organic technology. The first transparent conductive layer and the second transparent conductive layer may be made of a transparent conductive material such as indium tin oxide (ITO) or indium zinc oxide (IZO). The first conductive layer and the second conductive layer may be made of a metal material, such as any one or more of Argentum (Ag), Copper (Cu), Aluminum (Al), Titanium (Ti), and Molybdenum (Mo), or an alloy material of the abovementioned metals, such as an Aluminum-Neodymium alloy (AlNd) or a Molybdenum-Niobium alloy (MoNb), and may be a single-layer structure, or a multilayer composite structure such as Ti/Al/Ti. For example, the first conductive layer may be made of the metal Mo and the second conductive layer may be made of Ti/Al/Ti.

In some exemplary implementations, the material of the active layer of the photosensitive transistor located in the photosensitive region 201 may be different from the material of the active layer of the transistor for display located in the display region 10. For example, the semiconductor material adopted in the active layer of the photosensitive transistor may have a stronger photosensitivity than the material adopted in the active layer of the transistor for display. However, the present embodiment is not limited thereto.

In some exemplary implementations, as shown in FIG. 8, the photosensitive region 201 further includes a first shading layer 61 disposed on a base 60, and an orthographic projection of the first shading layer 61 on the base substrate 50 may cover an orthographic projection of the reference transistor unit 21 on the base substrate 50. The display region 10 also includes a second color filter layer provided on the base 60. The second color filter layer includes a filter unit 612 and a black matrix 611. An orthographic projection of the black matrix 611 on the base substrate 50 may cover an orthographic projection of the transistor for display on the base substrate 50. An orthographic projection of the filter unit 612 on the base substrate 50 overlaps with each of the orthographic projections of the pixel electrode 131 and the common electrode 132 in the display region 10 on the base substrate 50. A liquid crystal layer 70 may be disposed between the common electrode 132 and the second color filter layer. For example, the first shading layer 61 and the black matrix 611 of the second color filter layer may be an integrated structure. However, the present embodiment is not limited thereto. In some examples, the first shading layer in the photosensitive region and the second color filter layer in the display region may be prepared separately.

In some exemplary implementations, the photosensitive transistor and the pixel drive circuit in the display region may be prepared on the base substrate 50, and the first shading layer 61 and the second color filter layer may be prepared on the base 60. Then the base substrate 50 and the base 60 are paired and arranged into a box to be injected with liquid crystal material to form the liquid crystal layer 70, thereby obtaining a display substrate. However, the present embodiment is not limited thereto.

In some exemplary implementations, the ambient color temperature may be detected by using the photosensitive transistor units in the photosensitive region to achieve compensation of a color temperature of display to reach a white balance (i.e., white objects can be restored to white under whatever light source). When a color cast phenomenon appears in photographing under a specific light source, the white balance can be reached by the color temperature compensation, so that the color observed by human eyes is closer to reality. In some examples, when the indoor environment is reddened due to sunset, and the ratio of red, green and blue of ambient light is 2:1:1, if the display picture is not compensated, the human eyes will feel that the picture is reddened. If the display grayscale ratio of red, green and blue is adjusted to 1:2:2 by enhancing the blue and green ratios, the human eyes can see a picture of normal color temperature. In the present example, the photosensitive transistor units in the photosensitive region are used to sense the red, green and blue components of the ambient light, and the sensed red, green and blue components are used for compensating the display grayscales, thereby obtaining a display picture after color temperature compensation, so as to improve the display effect.

Figure 9:
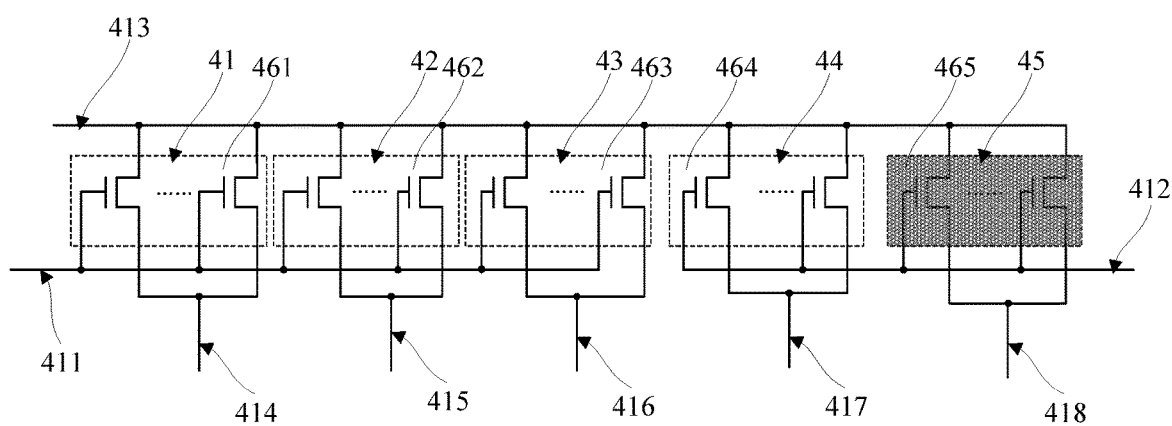
FIG. 9 is a schematic diagram of another structure of a photosensitive area according to at least one embodiment of the present disclosure.

FIG. 9 is a schematic diagram of another structure of a photosensitive region according to at least one embodiment of the present disclosure. In some exemplary implementations, as shown in FIG. 9, the photosensitive region 201 may be provided with a plurality of photosensitive transistor units. The plurality of photosensitive transistor units include a brightness sensing transistor unit 44, a reference transistor unit 45, a first color photosensitive transistor unit 41, a second color photosensitive transistor unit 42, and a third color photosensitive transistor unit 43. The photosensitive region 201 is also provided with a first color filter layer located at a side of the photosensitive transistor units away from the base substrate. The first color filter layer includes a first filter unit 461, a second filter unit 462, a third filter unit 463, a light transmission unit 464 and a shading unit 465. An orthographic projection of the first filter unit 461 on the base substrate contains an orthographic projection of the first color photosensitive transistor unit 41 on the base substrate. An orthographic projection of the second filter unit 462 on the base substrate contains an orthographic projection of the second color photosensitive transistor 42 on the base substrate. An orthographic projection of the third filter unit 463 on the base substrate contains an orthographic projection of the third color photosensitive transistor unit 43 on the base substrate. An orthographic projection of the light transmission unit 464 on the base substrate contains an orthographic projection of the brightness sensing transistor unit 44 on the base substrate. An orthographic projection of the shading unit 465 on the base substrate contains an orthographic projection of the reference transistor unit 45 on the base substrate. In some examples, the first color filter layer in the photosensitive region 201 and the second color filter layer in the display region may be located in the same layer, i.e., prepared by the same steps, thereby saving processes. However, the present embodiment is not limited thereto. For example, the first color filter layer may be formed separately in the photosensitive region 201, and the second color filter layer may be formed separately in the display region.

Figure 10:
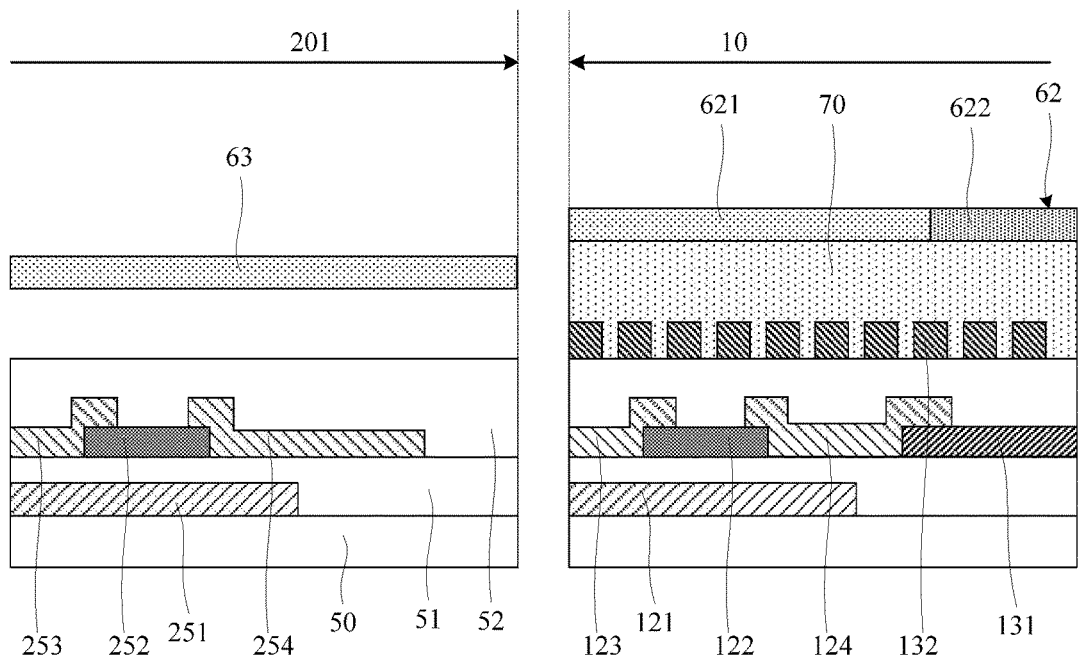
FIG. 10 is a schematic diagram of a partial section of a display substrate according to at least one embodiment of the present disclosure.

FIG. 10 is a schematic diagram of a partial section of a display substrate according to at least one embodiment of the present disclosure. FIG. 10 is a schematic diagram of a partial section taken along P-P' direction in FIG. 1. In FIG. 10, one photosensitive transistor in the photosensitive region 201 and one transistor for display in the display region 10 are illustrated as examples.

In some exemplary implementations, as shown in FIG. 10, in a plane perpendicular to the display substrate, the photosensitive region 201 is provided with a first color filter layer 63, and the display region 10 is provided with a second color filter layer 62. The second color filter layer 62 in the display region 10 may include a filter unit 622 and a black matrix 621. An orthographic projection of the black matrix 621 on the base substrate 50 may cover an orthographic projection of the transistor for display on the base substrate 50. An orthographic projection of the filter unit 622 on the base substrate 50 overlaps with each of orthographic projections of the pixel electrode 131 and the common electrode 132 in the display region 10 on the base substrate 50. A distance from the first color filter layer 63 in the photosensitive region 201 to the photosensitive transistor is smaller than a distance from the second color filter layer 62 in the display region 10 to the photosensitive transistor. In the present example, the photosensitive transistor and the transistor for display can be prepared by the same steps. The present exemplary implementation can ensure that a light ray irradiating the photosensitive transistor unit is a light ray filtered by a corresponding filter unit of the first color filter layer, and can ensure the accuracy of color temperature detection. Other description related to the sectional structure of the display substrate may refer to the description in the foregoing embodiments, and thus will not be repeated here.

In some exemplary implementations, as shown in FIG. 9, the first color photosensitive transistor unit 41 includes a plurality of first color photosensitive transistors, the second color photosensitive transistor unit 42 includes a plurality of second color photosensitive transistors, the third color photosensitive transistor unit 43 includes a plurality of third color photosensitive transistors, the brightness sensing transistor unit 44 includes a plurality of brightness sensing transistors, and the reference transistor unit 45 includes a plurality of reference transistors. Gate electrodes of the plurality of first color photosensitive transistors, the plurality of second color photosensitive transistors and the plurality of third color photosensitive transistors are connected with a fifth signal line 411. Gate electrodes of the plurality of brightness sensing transistors and the plurality of reference transistors are connected with a sixth signal line 412. First electrodes of the plurality of first color photosensitive transistors, the plurality of second color photosensitive transistors, the plurality of third color photosensitive transistors, the plurality of brightness sensing transistors and the plurality of reference transistors are connected with a seventh signal line 413. Second electrodes of the plurality of first color photosensitive transistors are connected with an eighth signal line 414. Second electrodes of the plurality of second color photosensitive transistors are connected with a ninth signal line 415. Second electrodes of the plurality of third color photosensitive transistors are connected with a tenth signal line 416. Second electrodes of the plurality of brightness sensing transistors are connected with an eleventh signal line 417. Second electrodes of the plurality of reference transistors are connected with a twelfth signal line 418. An input signal received by the seventh signal line 413 may be a square wave signal of a fixed frequency or a voltage. In some exemplary implementations, the first color photosensitive transistor unit 41, the second color photosensitive transistor unit 42, the third color photosensitive transistor unit 43, the brightness sensing transistor unit 44, and the reference transistor unit 45 are sequentially arranged along the row direction, and each of the photosensitive transistor units includes a plurality of transistors. For example, the first color photosensitive transistor unit 41 includes N1 first color photosensitive transistors, and these first color photosensitive transistors are arranged in a row. The second color photosensitive transistor unit 42 includes N2 second color photosensitive transistors, and these second color photosensitive transistors are arranged in a row. The third color photosensitive transistor unit 43 includes N3 third color photosensitive transistors, and these third color photosensitive transistors are arranged in a row. The brightness sensing transistor unit 44 includes N4 brightness sensing transistors, and these brightness sensing transistors are arranged in a row. The reference transistor unit 45 includes N5 reference transistors, and these reference transistors are arranged in a row. Herein, N1 to N5 are all integers. In some examples, N1 equals N2, N2 equals N3, and N4 equals N5. For example, N1 may be unequal to N4. Alternatively, in some examples, N1 to N5 may all be the same, for example, may be 300. However, the present embodiment is not limited thereto. For example, the transistors in any one photosensitive transistor unit may be arranged in multiple rows and columns.

In some exemplary implementations, in the photosensitive region 201, one row of transistors is arranged, which can reduce the occupied area of the photosensitive region. In some examples, a size of the photosensitive region 201 in the column direction may be 16 microns. However, the present embodiment is not limited thereto.

In some exemplary implementations, the first color photosensitive transistor unit 41 is configured to sense a red light component in the ambient light, the second color photosensitive transistor unit 42 is configured to sense a green light component in the ambient light, and the third color photosensitive transistor unit 43 is configured to sense a blue light component in the ambient light. The brightness sensing transistor unit 44 is configured to sense a brightness of the ambient light. The reference transistor unit 45 is configured to provide a reference current.

In some exemplary implementations, gate electrodes of the plurality of first color photosensitive transistors of the first color photosensitive transistor unit 41, the plurality of second color photosensitive transistors of the second color photosensitive transistor unit 42 and the plurality of third color photosensitive transistors of the third color photosensitive transistor unit 43 are all controlled by a first gate control signal provided by the fifth signal line 411, which can ensure the simultaneity of color collection. Gate electrodes of the plurality of brightness sensing transistors of the brightness sensing transistor unit 44 and the plurality of reference transistors of the reference transistor unit 45 are all controlled by a second gate control signal provided by the sixth signal line 412, which can ensure the simultaneity of brightness detection. The three color photosensitive transistor units may be configured to perform a color temperature adjustment, and the brightness sensing transistor unit and the reference transistor unit may be configured to perform an ambient light brightness adjustment. The reference transistor unit can provide reference information for the color temperature adjustment and the ambient light brightness adjustment, which can save the space designed.

In some exemplary implementations, under an action of the first gate control signal provided by the fifth signal line 411, the plurality of first color photosensitive transistors, the plurality of second color photosensitive transistors and the plurality of third color photosensitive transistors are all turned on, and a first color detection current can be obtained through the eighth signal line 414, a second color detection current can be obtained through the ninth signal line 415, and a third color detection current can be obtained through the tenth signal line 416. In this example, since the detection current generated by one transistor is too small, a voltage value $V_r$ of the red light in ambient light can be obtained through accumulating a detection current generated by a transistor unit for sampling, converting it into voltage through a high-precision resistor, and sampling the voltage by using a 16-bit Analog-to-Digital Converter (ADC). In the same way, a voltage value $V_g$ of the green light, a voltage value $V_b$ of the blue light, a voltage value $V_w$ of the white light in ambient light and a reference voltage value $V_{basic}$ can be obtained. The $V_{basic}$ is an inductance obtained under a no light condition, which can be used to eliminate an influence of temperature. Then, $V_r-V_{basic}$, $V_g-V_{basic}$, $V_b-V_{basic}$ and $V_w-V_{basic}$ are calculated respectively, and these values are voltage variations caused by actual ambient light. Then, illumination values of R, G, B and ambient light can be obtained by comparing an ambient illumination voltage curve. After the illumination voltage values of the three colors R, G and B are obtained, the compensation weight values for R, G and B color temperatures can be calculated according to a conventional white balance algorithm (such as Gray World, Perfect Reflector Assumption, or Color Temperature Estimation, etc.), and fed back to the control integrated circuit, and then a picture compensated according to the display white balance algorithm in the control integrated circuit is output, thereby realizing the compensation of display color temperature.

Figure 11:
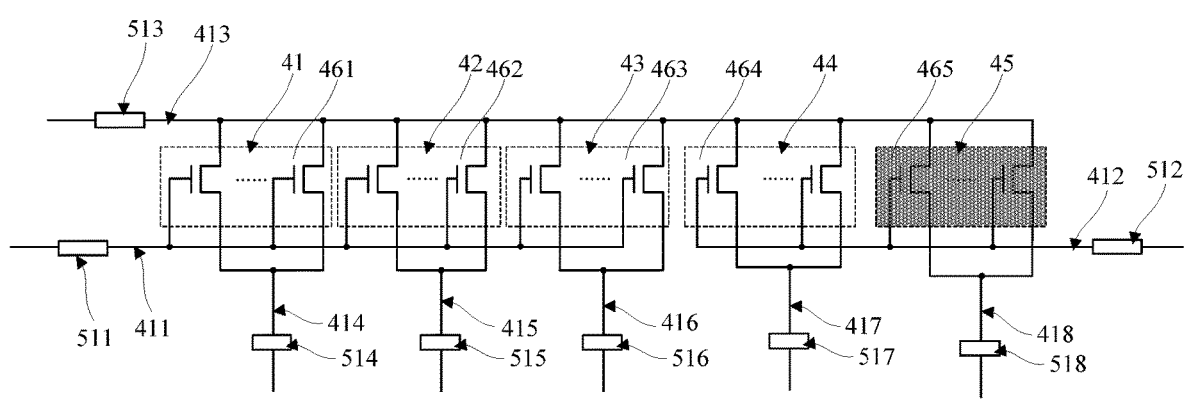
FIG. 11 is a schematic diagram of another structure of a photosensitive area according to at least one embodiment of the present disclosure.

FIG. 11 is a schematic diagram of another structure of a photosensitive region according to at least one embodiment of the present disclosure. In some exemplary implementations, as shown in FIG. 11, the photosensitive region is also provided with a plurality of photosensitive ESD protection units, for example, a fifth photosensitive ESD protection unit 511, a sixth photosensitive ESD protection unit 512, a seventh photosensitive ESD protection unit 513, an eighth photosensitive ESD protection unit 514, a ninth photosensitive ESD protection unit 515, a tenth photosensitive ESD protection unit 516, an eleventh photosensitive ESD protection unit 517 and a twelfth photosensitive ESD protection unit 518. However, the present embodiment is not limited thereto. In some examples, the plurality of photosensitive ESD protection units may be disposed in the peripheral region outside the photosensitive region.

In some exemplary implementations, the fifth signal line 411 to the twelfth signal line 418 are each connected with a photosensitive ESD protection unit. For example, the fifth signal line 411 is connected with the fifth photosensitive ESD protection unit 511, the sixth signal line 412 is connected with the sixth photosensitive ESD protection unit 512, the seventh signal line 413 is connected with the seventh photosensitive ESD protection unit 513, the eighth signal line 414 is connected with the eighth photosensitive ESD protection unit 514, the ninth signal line 415 is connected with the ninth photosensitive ESD protection unit 515, the tenth signal line 416 is connected with the tenth photosensitive ESD protection unit 516, the eleventh signal line 417 is connected with the eleventh photosensitive ESD protection unit 517, and the twelfth signal line 418 is connected with the twelfth photosensitive ESD protection unit 518. At least one of the fifth photosensitive ESD protection unit 511 to the twelfth photosensitive ESD protection unit 518 may be directly connected with the common signal line, or connected to the common signal ESD ring in the display region, or connected to a data line ESD protection unit nearby. However, the present embodiment is not limited thereto.

In some exemplary implementations, the fifth signal line 411 to the twelfth signal line 418 may each be connected with one photosensitive ESD protection unit to achieve an ESD protection effect. For example, the photosensitive ESD protection unit connected with the seventh signal line 413 may be located at a side of the plurality of photosensitive transistor units away from the display region, and directly connected with the common signal line; the photosensitive ESD protection units connected with the fifth signal line 411, the sixth signal line 412, and the eighth signal line 414 to the twelfth signal line 418 may be located at a side of the plurality of photosensitive transistor units close to the display region, and are connected with the common signal ESD ring in the display region or the data line ESD protection unit in the peripheral region to realize a connection with the common signal line and achieve the ESD protection function. The arrangement of the plurality of signal lines and the photosensitive ESD protection units of the present embodiment may refer to the description of the foregoing embodiment, and thus will not be repeated here.

The display substrate provided by the exemplary implementation can realize color temperature detection by using photosensitive transistor units, thereby realizing color temperature compensation for display and improving the display effect.

Figure 12:
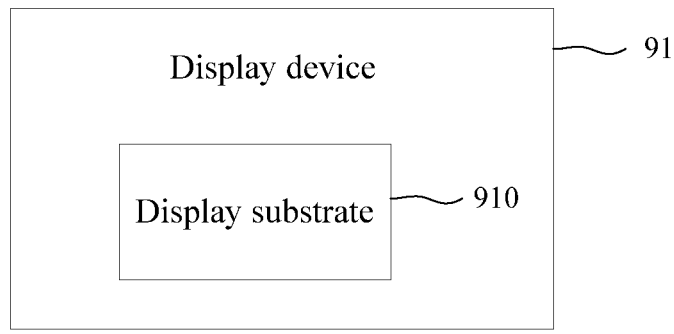
FIG. 12 is a schematic diagram of a display device according to at least one embodiment of the present disclosure.

FIG. 12 is a schematic diagram of a display device according to at least one embodiment of the present disclosure. As shown in FIG. 12, the present embodiment provides a display device 91, which includes a display substrate 910 according to a foregoing embodiment. In some examples, the display substrate 910 may be an LCD display substrate, an OLED display substrate, a QLED display substrate, a Micro-LED display substrate or a Mini-LED display substrate. The display device 91 may be any product or component with a display function, such as a mobile phone, a tablet computer, a television, a display, a notebook computer, a digital photo frame, and a navigator. However, the present embodiment is not limited thereto.

Figure 13:
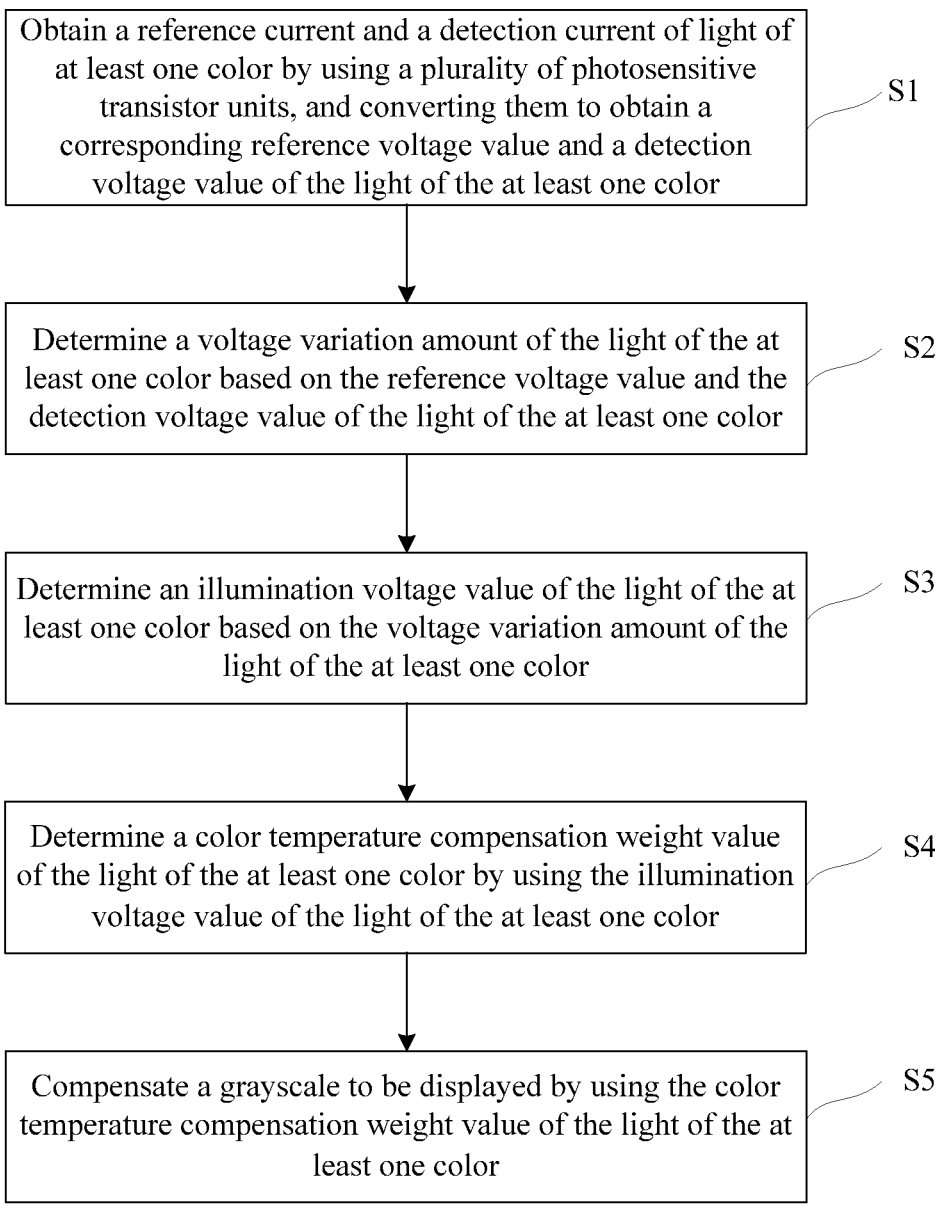
FIG. 13 is a flowchart of a compensation method for a display device according to at least one embodiment of the present disclosure.

FIG. 13 is a flowchart of a compensation method for a display device according to at least one embodiment of the present disclosure. The compensation method for the display device of the present embodiment can be applied to the display device as described above. In some exemplary implementations, as shown in FIG. 13, the compensation method for the display device may include the following steps:

Step S1, obtaining a reference current and a detection current of light of at least one color by using a plurality of photosensitive transistor units, and converting them to obtain a corresponding reference voltage value and a detection voltage value of the light of the at least one color;

Step S2, determining a voltage variation amount of the light of the at least one color based on the reference voltage value and the detection voltage value of the light of the at least one color;

Step S3, determining an illumination voltage value of the light of the at least one color based on the voltage variation amount of the light of the at least one color;

Step S4, determining a color temperature compensation weight value of the light of the at least one color by using the illumination voltage value of the light of the at least one color; and Step S5, compensating a grayscale to be displayed by using the color temperature compensation weight value of the light of the at least one color.

In the present exemplary implementation, detection currents and reference currents of light of different colors are obtained by using a plurality of photosensitive transistor units, and color temperature compensation is performed based on the reference currents and detection currents of light of different colors to improve the display effect.

For relevant description of the compensation method of the present embodiment, reference may be made to the description of the forgoing embodiments, and thus will not be repeated here.

The accompanying drawings in the present disclosure only relate to the structures related to the present disclosure, and another structure may refer to a general design. The embodiments in the present disclosure, i.e., features in the embodiments, may be combined with each other to obtain new embodiments if there is no conflict. Those of ordinary skill in the art should understand that modification or equivalent replacement may be made to the technical solutions of the present disclosure without departing from the spirit and the scope of the technical solutions of the present disclosure, and should all fall within the scope of the claims of the present disclosure.

The invention claimed is:

1. A display substrate, comprising:
a base substrate, comprising a display region, a peripheral region located at a periphery of the display region and a binding region located at a side of the display region; and
a plurality of photosensitive transistor units, a plurality of photosensitive electrostatic discharge (ESD) protection units and at least one common signal line located in the peripheral region;
wherein the plurality of photosensitive transistor units are connected with binding pins in the binding region through a plurality of signal lines; and
at least one photosensitive ESD protection unit is connected with at least one signal line and a common signal line and located between the at least one signal line and the common signal line,
wherein the display substrate further comprises: a first color filter layer located in the peripheral region and on a side of the plurality of photosensitive transistor units away from the base substrate; the first color filter layer comprises a first filter unit, a second filter unit, a third filter unit, a light transmission unit and a shading unit;
the plurality of photosensitive transistor units comprises a brightness sensing transistor unit, a reference transistor unit, a first color photosensitive transistor unit, a second color photosensitive transistor unit, and a third color photosensitive transistor unit.

2. The display substrate according to claim 1, wherein the display region is provided with a common signal ESD ring connected with the common signal line; and at least one photosensitive ESD protection unit is connected with the common signal ESD ring.

3. The display substrate according to claim 2, wherein the peripheral region is further provided with a data line ESD protection unit, and the data line ESD protection unit is connected with the common signal ESD ring in the display region;
the plurality of photosensitive transistor units are located at a side of the data line ESD protection unit away from the display region, and at least one photosensitive ESD protection unit is connected with the data line ESD protection unit.

4. The display substrate according to claim 1, wherein the peripheral region is provided with a gate drive circuit, and the plurality of signal lines are located at a side of the gate drive circuit close to the display region.

5. The display substrate according to claim 4, wherein the at least one common signal line is located at a side of the gate drive circuit away from the display region.

6. The display substrate according to claim 1, wherein the display substrate further comprises: a first shading layer located on a side of the plurality of photosensitive transistor units away from the base substrate;
the plurality of photosensitive transistor units at least comprises: a reference transistor unit and a brightness sensing transistor unit; an orthographic projection of the first shading layer on the base substrate contains an orthographic projection of the reference transistor unit on the base substrate, and the orthographic projection of the first shading layer on the base substrate does not overlap or partially overlaps with an orthographic projection of the brightness sensing transistor unit on the base substrate.

7. The display substrate according to claim 6, wherein the reference transistor unit comprises a plurality of reference transistors and the brightness sensing transistor unit comprises a plurality of brightness sensing transistors;
the plurality of signal lines at least comprises a first signal line, a second signal line, a third signal line and a fourth signal line;
gate electrodes of the plurality of reference transistors and the plurality of brightness sensing transistors are connected with the first signal line, first electrodes of the plurality of reference transistors and the plurality of brightness sensing transistors are connected with the second signal line, second electrodes of the plurality of reference transistors are connected with the third signal line, and second electrodes of the plurality of brightness sensing transistors are connected with the fourth signal line.

8. The display substrate according to claim 7, wherein the plurality of photosensitive ESD protection units comprises: a first photosensitive ESD protection unit, a second photosensitive ESD protection unit, a third photosensitive ESD protection unit, and a fourth photosensitive ESD protection unit;

the first signal line is connected with the first photosensitive ESD protection unit, the second signal line is connected with the second photosensitive ESD protection unit, the third signal line is connected with the third photosensitive ESD protection unit, and the fourth signal line is connected with the fourth photosensitive ESD protection unit;

the first photosensitive ESD protection unit and the second photosensitive ESD protection unit are located at a side of the plurality of photosensitive transistor units away from the display region, and the third photosensitive ESD protection unit and the fourth photosensitive ESD protection unit are located at a side of the plurality of photosensitive transistor units close to the display region.

9. The display substrate according to claim 8, wherein the first photosensitive ESD protection unit and the second photosensitive ESD protection unit are directly connected with the common signal line; the third photosensitive ESD protection unit and the fourth photosensitive ESD protection unit are connected with the common signal ESD ring in the display region.

10. The display substrate according to claim 1, wherein an orthographic projection of the first filter unit on the base substrate contains an orthographic projection of the first color photosensitive transistor unit on the base substrate, an orthographic projection of the second filter unit on the base substrate contains an orthographic projection of the second color photosensitive transistor unit on the base substrate, an orthographic projection of the third filter unit on the base substrate contains the orthographic projection of the third color photosensitive transistor unit on the base substrate, an orthographic projection of the light transmission unit on the base substrate contains an orthographic projection of the brightness sensing transistor unit on the base substrate, and an orthographic projection of the shading unit on the base substrate contains an orthographic projection of the reference transistor unit on the base substrate.

11. The display substrate according to claim 10, wherein the display substrate further comprises: a second color filter layer located in the display region; and the second color filter layer and the first color filter layer are located in a same layer.

12. The display substrate according to claim 10, wherein the display substrate further comprises: a second color filter layer located in the display region;

in a plane perpendicular to the display substrate, a distance from the first color filter layer to the photosensitive transistor units is smaller than a distance from the second color filter layer to the photosensitive transistor units.

13. The display substrate according to claim 10, wherein the first color photosensitive transistor unit comprises a plurality of first color photosensitive transistors, the second color photosensitive transistor unit comprises a plurality of second color photosensitive transistors, the third color photosensitive transistor unit comprises a plurality of third color photosensitive transistors, the brightness sensing transistor unit comprises a plurality of brightness sensing transistors, and the reference transistor unit comprises a plurality of reference transistors;

the plurality of signal lines comprises a fifth signal line, a sixth signal line, a seventh signal line, an eighth signal line, a ninth signal line, a tenth signal line, an eleventh signal line, and a twelfth signal line;

gate electrodes of the plurality of first color photosensitive transistors, the plurality of second color photosensitive transistors and the plurality of third color photosensitive transistors are connected with the fifth signal line;

gate electrodes of the plurality of brightness sensing transistors and the plurality of reference transistors are connected with the sixth signal line;

first electrodes of the plurality of first color photosensitive transistors, the plurality of second color photosensitive transistors, the plurality of third color photosensitive transistors, the plurality of brightness sensing transistors and the plurality of reference transistors are connected with the seventh signal line;

second electrodes of the plurality of first color photosensitive transistors are connected with the eighth signal line;

second electrodes of the plurality of second color photosensitive transistors are connected with the ninth signal line;

second electrodes of the plurality of third color photosensitive transistors are connected with the tenth signal line;

second electrodes of the plurality of brightness sensing transistors are connected with the eleventh signal line; and second electrodes of the plurality of reference transistors are connected with the twelfth signal line.

14. The display substrate according to claim 13, wherein the fifth signal line to the twelfth signal line are each connected with one photosensitive ESD protection unit.

15. The display substrate according to claim 13, wherein a quantity of first color photosensitive transistors comprised in the first color photosensitive transistor unit, a quantity of second color photosensitive transistors comprised in the second color photosensitive transistor unit, and a quantity of third color photosensitive transistors comprised in the third color photosensitive transistor unit are the same; and a quantity of brightness sensing transistors comprised in the brightness sensing transistor unit is the same as a quantity of reference transistors comprised in the reference transistor unit.

16. The display substrate according to claim 15, wherein the quantity of first color photosensitive transistors comprised in the first color photosensitive transistor unit is different from the quantity of brightness sensing transistors comprised in the brightness sensing transistor unit.

17. The display substrate according to claim 1, wherein the plurality of photosensitive transistor units is sequentially arranged along a first direction.

18. The display substrate according to claim 1, wherein in a plane perpendicular to the display substrate, the display substrate comprises: a first conductive layer, a semiconductor layer and a second conductive layer sequentially arranged on the base substrate, wherein the first conductive layer at least comprises gate electrodes of transistors in the photosensitive transistor units, the semiconductor layer at least comprises active layers of the transistors in the photosensitive transistor units, and the second conductive layer at least comprises first electrodes and second electrodes of the transistors in the photosensitive transistor units.

19. A display device, comprising the display substrate according to claim 1.

20. A compensation method for a display device, applied to the display device according to claim 19, the compensation method comprising:
- obtaining a reference current and a detection current of light of at least one color by using a plurality of photosensitive transistor units, and converting the reference current and the detection current of the light of the at least one color to obtain a corresponding reference voltage value and a detection voltage value of the light of the at least one color;
- determining a voltage variation amount of the light of the at least one color based on the reference voltage value and the detection voltage value of the light of the at least one color;
- determining an illumination voltage value of the light of the at least one color based on the voltage variation amount of the light of the at least one color;
- determining a color temperature compensation weight value of the light of the at least one color by using the illumination voltage value of the light of the at least one color; and
- compensating a grayscale to be displayed by using the color temperature compensation weight value of the light of the at least one color.

* * * * *